(12) United States Patent
Takahashi et al.

(10) Patent No.: US 11,906,363 B2
(45) Date of Patent: Feb. 20, 2024

(54) INFRARED SENSOR, INFRARED SENSOR ARRAY, AND METHOD OF MANUFACTURING INFRARED SENSOR

(71) Applicant: Panasonic Intellectual Property Management Co., Ltd., Osaka (JP)

(72) Inventors: Kouhei Takahashi, Osaka (JP); Naoki Tambo, Kyoto (JP); Kunihiko Nakamura, Osaka (JP); Masaki Fujikane, Osaka (JP); Yasuyuki Naito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 157 days.

(21) Appl. No.: 17/347,470

(22) Filed: Jun. 14, 2021

(65) Prior Publication Data
US 2021/0302237 A1 Sep. 30, 2021

Related U.S. Application Data

(63) Continuation of application No. PCT/JP2019/037204, filed on Sep. 24, 2019.

(30) Foreign Application Priority Data

Feb. 28, 2019 (JP) .................. 2019-035359

(51) Int. Cl.
*G01J 5/22* (2006.01)
*H01L 31/09* (2006.01)
(Continued)

(52) U.S. Cl.
CPC .............. *G01J 5/22* (2013.01); *H01L 31/095* (2013.01); *H01L 31/20* (2013.01); *G01J 2005/204* (2013.01)

(58) Field of Classification Search
CPC ........ G01J 5/22; G01J 2005/204; G01J 5/023; G01J 5/024; G01J 5/046; G01J 5/20;
(Continued)

(56) References Cited

U.S. PATENT DOCUMENTS 6,194,722 B1 2/2001 Fiorini et al.
2003/0178565 A1 9/2003 Shigenaka et al.
(Continued)

FOREIGN PATENT DOCUMENTS

CN 107490437 A 12/2017
JP 1-220472 9/1989
(Continued)

OTHER PUBLICATIONS

International Search Report of PCT application No. PCT/JP2019/037204 dated Dec. 24, 2019.
(Continued)

*Primary Examiner* — David P Porta
*Assistant Examiner* — Gisselle M Gutierrez
(74) *Attorney, Agent, or Firm* — McDermott Will & Emery LLP

(57) ABSTRACT

An infrared sensor includes: a base substrate; a bolometer infrared receiver; a first beam; and a second beam. Each of the first and second beams has a connection portion connected to the base substrate and/or a member on the base substrate and a separated portion away from the base substrate, and is physically joined to the infrared receiver at the separated portion. The infrared receiver is supported by the first and second beams to be away from the base substrate. The infrared receiver includes a resistance change portion including a resistance change material the electrical resistance of which changes with temperature. The resistance change portion includes an amorphous semiconductor, and the first and second beams include a crystalline semicon-
(Continued)

ductor made of the same base material as the resistance change material, and is electrically connected to the resistance change portion at the separated portion.

13 Claims, 19 Drawing Sheets

(51) Int. Cl.
    *H01L 31/20*     (2006.01)
    *G01J 5/20*     (2006.01)

(58) Field of Classification Search
    CPC ..... H01L 31/095; H01L 31/20; H01L 27/144; H10N 15/00
    See application file for complete search history.

(56) References Cited

U.S. PATENT DOCUMENTS

| | | | |
|---|---|---|---|
| 2009/0114819 A1 | 5/2009 | Yamanaka et al. | |
| 2009/0262778 A1* | 10/2009 | Ikushima | G01J 5/12 374/121 |
| 2010/0148067 A1* | 6/2010 | Cheon | G01J 5/022 216/13 |
| 2012/0196150 A1 | 8/2012 | Tsuchiya et al. | |
| 2014/0226021 A1 | 8/2014 | Koechlin et al. | |
| 2015/0015930 A1 | 1/2015 | Hussein et al. | |
| 2016/0069739 A1* | 3/2016 | Howard | G01J 5/20 216/13 |
| 2017/0356806 A1* | 12/2017 | Takahashi | G01J 5/12 |

FOREIGN PATENT DOCUMENTS

| | | |
|---|---|---|
| JP | 2003-279406 | 10/2003 |
| JP | 2007-078680 | 3/2007 |
| JP | 2008-082790 A | 4/2008 |
| JP | 2017-223644 | 12/2017 |
| WO | 2011/027774 | 3/2011 |
| WO | 2013/145052 | 10/2013 |

OTHER PUBLICATIONS

The Extended European Search Report dated Apr. 12, 2022 for the related European Patent Application No. 19917458.2.
English Translation of Chinese Search Report dated Sep. 5, 2023 for the related Chinese Patent Application No. 201980074167.3.

\* cited by examiner

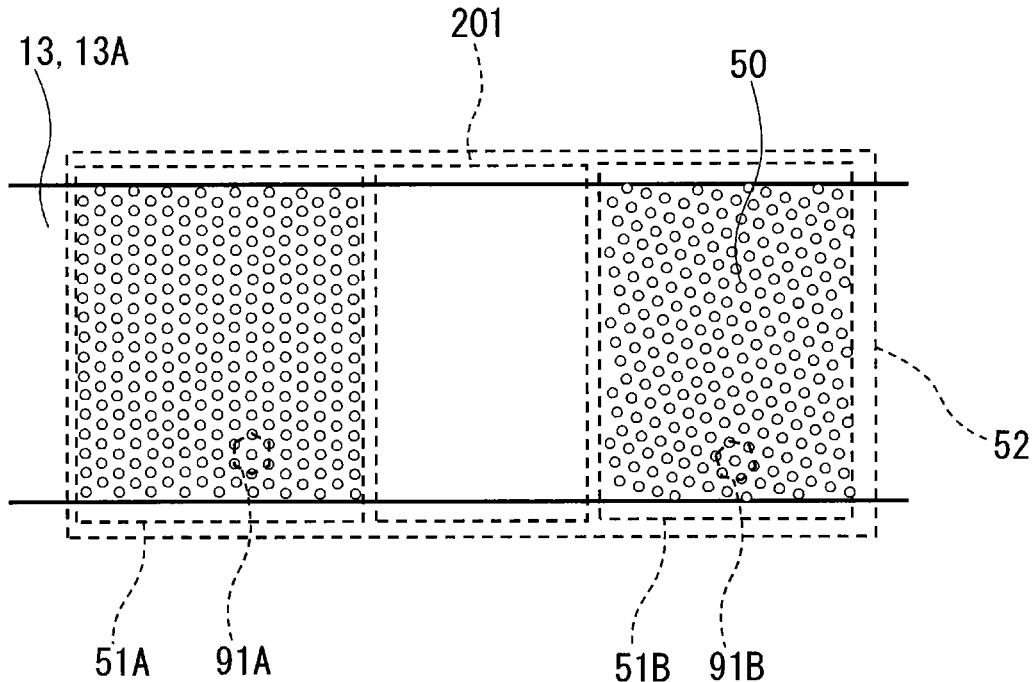
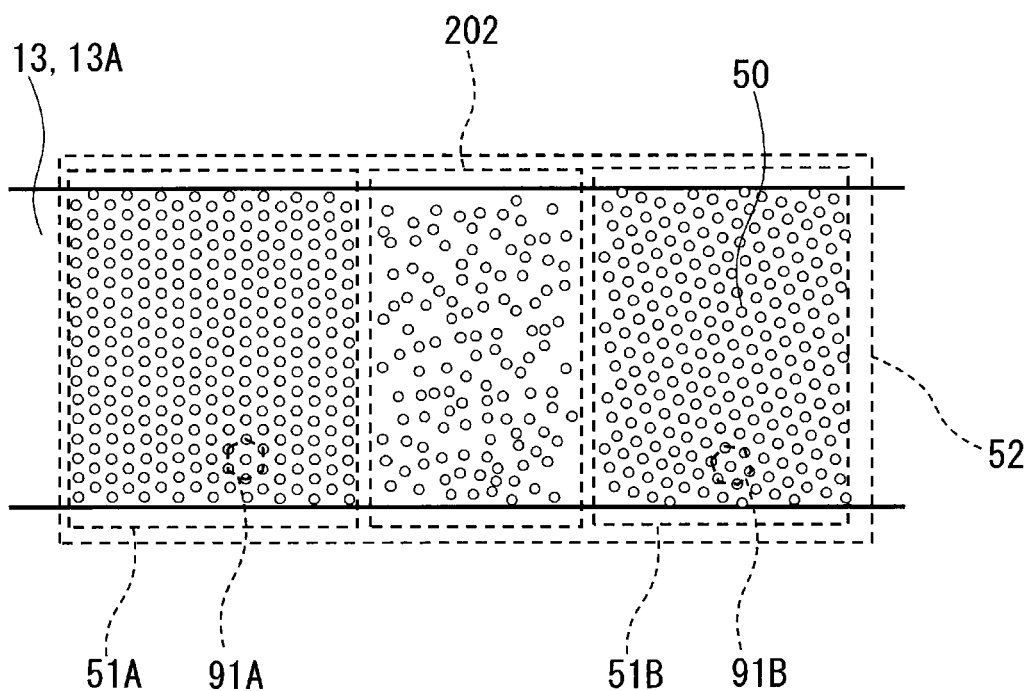

INFRARED SENSOR, INFRARED SENSOR ARRAY, AND METHOD OF MANUFACTURING INFRARED SENSOR

BACKGROUND

1. Technical Field

The present disclosure relates to an infrared sensor, an infrared sensor array, and a method of manufacturing an infrared sensor.

2. Description of the Related Art

In the field of infrared sensors, there has been proposed a structure in which an infrared receiver is disposed to be away from the base substrate by using beams. This structure aims at thermally insulating the infrared receiver from the base substrate. In an infrared sensor having this structure, the higher the thermal insulation performance of the beams is, the more the infrared-light receiving sensitivity is improved. Japanese Unexamined Patent Application Publication No. 2017-223644 (hereinafter referred to as PTL 1) discloses a technique of using a phononic crystal structure to increase the thermal insulation performance of the beams.

There is a type of an infrared sensor called a bolometer sensor. The bolometer sensor is also referred to as a thermistor sensor. The infrared receiver of a bolometer sensor includes a resistance change material the electrical resistance of which changes with temperature. The infrared sensor disclosed in PTL 1 includes a bolometer sensor.

SUMMARY

One non-limiting and exemplary embodiment provides a technique to increase the infrared-light receiving sensitivity of a bolometer infrared sensor.

In one general aspect, the techniques disclosed here feature an infrared sensor including: a base substrate; a bolometer infrared receiver; a first beam; and a second beam, in which each of the first beam and the second beam has a connection portion connected to the base substrate and/or a member on the base substrate and a separated portion away from the base substrate, and is physically joined to the infrared receiver at the separated portion, the infrared receiver is supported by the first beam and the second beam to be away from the base substrate, the infrared receiver includes a resistance change portion including a resistance change material the electrical resistance of which changes with temperature, the resistance change portion includes an amorphous semiconductor, and each of the first beam and the second beam includes a crystalline semiconductor made of a base material the same as a base material of the resistance change material, and is electrically connected to the resistance change portion at the separated portion.

The infrared sensor of the present disclosure is a bolometer sensor that can have a high infrared-light receiving sensitivity.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 9 is a schematic plan view of further still another example of a phononic crystal structure that the beam of the infrared sensor of the present disclosure can have;

FIG. 10 is a schematic plan view of an example, which is different from the above examples, of a phononic crystal structure that the beam of the infrared sensor of the present disclosure can have;

DETAILED DESCRIPTION (Underlying Knowledge Forming Basis of Present Disclosure)

According to study of the inventors, the infrared-light receiving sensitivity of a bolometer infrared sensor is improved not only by improving the thermal insulation performance of the beams but also by reducing the thermal noise $n_{therm}$. The thermal noise $N_{therm}$ is a parameter proportional to the ½ power of the total electric resistance $R_{all}$ of the infrared sensor. The total electric resistance $R_{all}$ of an infrared sensor is typically the total electric resistance between the connection terminals connected to the readout integrated circuit (ROIC) in the infrared sensor. The total electric resistance $R_{all}$ is typically expressed as the sum of the electric resistance $R_{stud}$ of the connection terminals, the electric resistance $R_{wiring}$ of the wiring for electrically connecting the connection terminals and a resistance change portion, the electric resistance $R_{thermister}$ of the resistance change portion, and the interface electric resistance $R_{interface}$ at the interfaces between the resistance change portion and the wiring. In the infrared sensor of the present disclosure, a first beam and a second beam function as wiring. The base material of the resistance change portion and the base material of the first and second beams are the same. This configuration reduces the slope of the energy bands at the interface between those parts, making it possible to reduce the interface electric resistance $R_{interface}$. The reduction in the interface electric resistance $R_{interface}$ in turn reduces the thermal noise $N_{therm}$. Thus, the infrared sensor of the present disclosure can achieve a high light receiving sensitivity.

EMBODIMENTS OF PRESENT DISCLOSURE

Hereinafter, embodiments of the present disclosure will be described with reference to the drawings. Note that the embodiments described below are all comprehensive or concrete examples. In the following embodiments, numerical values, shapes, materials, constituents, the arrangement positions and the ways of connections of the constituents, process conditions, steps, the order of steps, and the like are examples, which are not intended to limit the present disclosure. Of the constituents in the following embodiments, the constituents not stated in independent claims which express the highest concepts are described as optional constituents. In addition, each figure is a schematic diagram which is not necessarily illustrated precisely.

[Infrared Sensor]

Embodiment 1

Figure 1A:
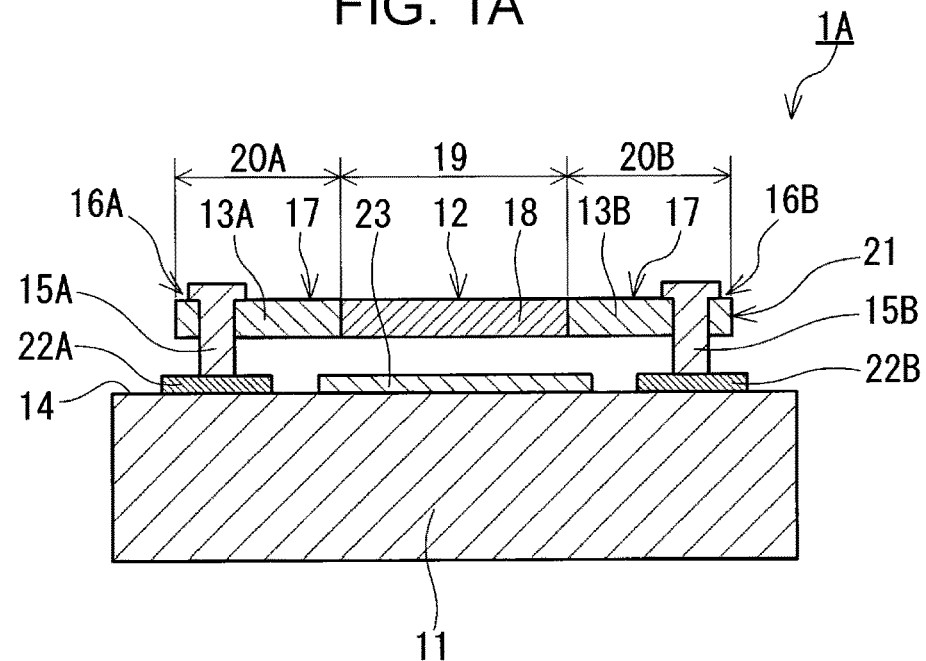
FIG. 1A is a schematic cross-sectional view of an infrared sensor of embodiment 1.
Figure 1B:
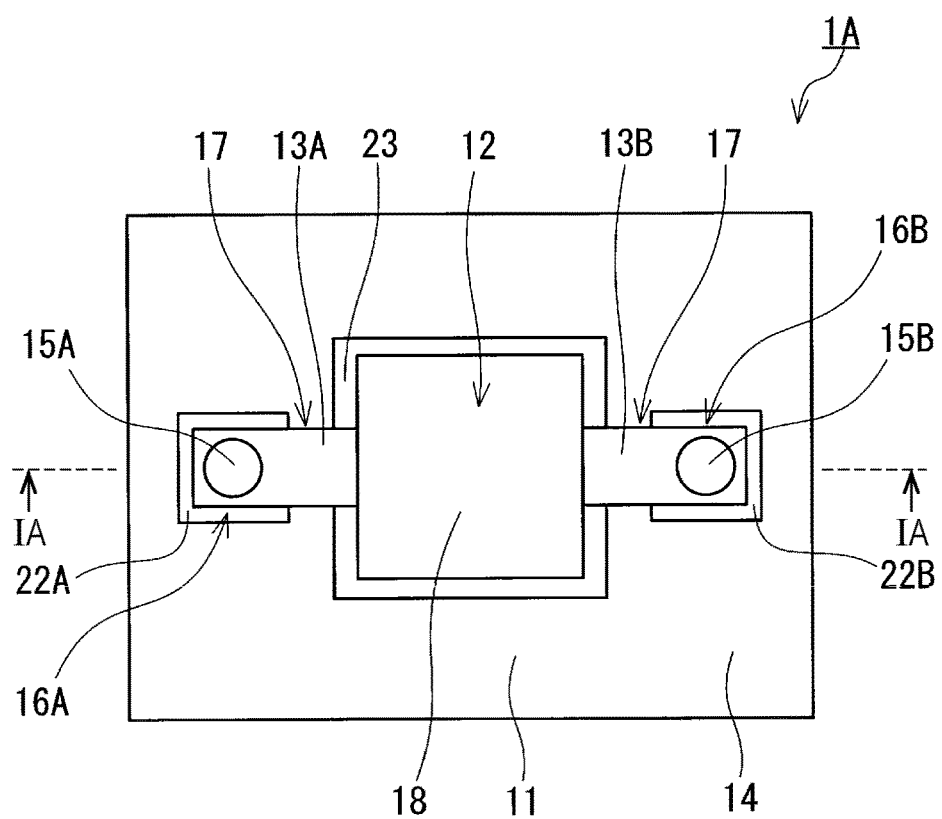
FIG. 1B is a schematic plan view of the infrared sensor of embodiment 1.

An infrared sensor of embodiment 1 is illustrated in FIGS. 1A and 1B. FIG. 1A illustrates a cross-sectional view of an infrared sensor 1A in FIG. 1B taken along line IA-IA. The infrared sensor 1A is a bolometer infrared sensor which is a type of a thermal infrared sensor. The infrared sensor 1A includes a base substrate 11, a bolometer infrared receiver 12, a first beam 13A, and a second beam 13B. Each of the first beam 13A and the second beam 13B has a connection portion 16A or 16B connected to a member on the base substrate 11 and a separated portion 17 which is away from the base substrate 11. Each of the first beam 13A and the second beam 13B has the connection portion 16A or 16B at its one end. Each of the first beam 13A and the second beam 13B is physically joined to the infrared receiver 12 at its separated portion 17. The position at which each of the first beam 13A and the second beam 13B is physically joined to the infrared receiver 12 is its end on the other side. The infrared receiver 12 is supported by the first beam 13A and the second beam 13B so as to be away from the base substrate 11. This separation increases the degree of thermal insulation between the base substrate 11 and the infrared receiver 12. The first beam 13A and the second beam 13B are electrically conductive. The first beam 13A and the second beam 13B have a function of physically supporting the infrared receiver 12 and a function as a path of the current, in other words, as wiring, for detecting the resistance of the resistance change portion in the infrared receiver 12.

The infrared sensor 1A further includes a first prop 15A and a second prop 15B that are members disposed on the base substrate 11 and extend in a direction away from the upper surface 14 of the base substrate 11. The first prop 15A and the second prop 15B are members on the base substrate 11. The first prop 15A and the second prop 15B are electrically conductive. The first beam 13A is connected to the first prop 15A at the connection portion 16A. The second beam 13B is connected to the second prop 15B at the connection portion 16B. At the connection portion 16A, the first beam 13A and the first prop 15A are physically and electrically connected to each other. At the connection portion 16B, the second beam 13B and the second prop 15B are physically and electrically connected to each other. In cross-sectional view, the infrared receiver 12, the first beam 13A, and the second beam 13B are suspended by the first prop 15A and the second prop 15B over the base substrate 11. In the infrared sensor 1A illustrated in FIGS. 1A and 1B, the separation between the base substrate 11 and the infrared receiver 12 is achieved by means of the foregoing suspension by the first prop 15A and the second prop 15B. The first prop 15A and the second prop 15B have a function of physically supporting the infrared receiver 12, the first beam 13A, and the second beam 13B and a function as a path of the current for detecting the resistance of the resistance change portion in the infrared receiver 12.

The infrared receiver 12 includes a resistance change portion 18 including a resistance change material the electrical resistance of which changes with temperature. Although one or two or more kinds of the resistance change material may be included in the resistance change portion 18, typically one kind thereof is included. The resistance change portion 18 is made of an amorphous semiconductor. Each of the first beam 13A and the second beam 13B includes a crystalline semiconductor made of the same base material as a base material of the resistance change material. Each of the first beam 13A and the second beam 13B is electrically connected to the resistance change portion 18 of the infrared receiver 12 at its separated portion 17. The resistance change portion 18 and the first and second beams 13A and 13B are the amorphous region 19 and the crystalline regions 20A and 20B, respectively, of the semiconductor layer 21 including the foregoing base material. The semiconductor layer 21 is a single layer. The infrared sensor 1A having this configuration has a high affinity for semiconductor manufacturing technology, as can be seen from the manufacturing method described later. The semiconductor layer 21 has a thickness, for example, larger than or equal to 50 nm and smaller than or equal to 500 nm.

The resistance change portion 18 includes an amorphous semiconductor. In contrast, the first beam 13A and the second beam 13B include a crystalline semiconductor. Here, the base material of the semiconductor included in the resistance change portion 18 and the base material of the semiconductor included in the first beam 13A and the second beam 13B are the same. The base material is, for example, silicon (Si) or silicon germanium (SiGe). The base material may be Si or SiGe. Note that the term "crystalline semiconductor" in this specification means a semiconductor having a content of a crystallized base material, for example, higher than or equal to 50% by mass, higher than or equal to 70% by mass, higher than or equal to 80% by mass, higher than or equal to 90% by mass, or higher than or equal to 95 mass %. In a "crystalline semiconductor", the content of a crystallized base material may be 100% by mass. The term "amorphous semiconductor" means a semiconductor having a content of a crystallized base material, for example, lower than 50% by mass, lower than 30% by mass, lower than 20% by mass, lower than 10% by mass, or lower than 5% by mass. In an "amorphous semiconductor", the content of the crystallized base material may be 0% by mass. The content of a crystallized base material can be evaluated by, for example, X-ray diffraction.

The first beam 13A and the second beam 13B are electrically conductive. Hence, the semiconductor included in the first beam 13A and the second beam 13B are typically doped with impurities at a high concentration. The concentration of impurities with which this semiconductor is doped is, for example, $10^{17}$ to $10^{23}$ cm$^{-3}$ or, it may be $10^{19}$ to $10^{21}$ cm$^{-3}$. The impurities are elements different from the element included in the base material. In the case where the base material is Si or SiGe, the impurities are, for example, boron (B) or phosphorus (P).

At the boundary between the resistance change portion 18 and the first beam 13A and/or the second beam 13B, in other words, at the interface between them, the concentration of the impurities with which the base material is doped is preferably changed continuously in the direction normal to the interface. This configuration makes it possible to reduce the interface electric resistance $R_{interface}$ more reliably. In a possible configuration, as an example, the doping concentration gradient of the impurities along the direction normal to the interface in the vicinity of the interface may be smaller than or equal to $10^{18}$ cm$^{-3}$/nm. Here, the vicinity of the interface means the area from the interface to the region a specified distance (for example, 100 nm) away from the interface in the direction normal to the interface. Note that the foregoing change in concentration is achieved, for example, by the diffusion of part of the impurities with which the base material of the semiconductor included in the first beam 13A and/or the second beam 13B is doped.

In the infrared sensor 1A, the resistance of the resistance change portion 18 included in the infrared receiver 12 is read out. For the readout, the infrared sensor 1A illustrated in FIGS. 1A and 1B further includes a readout integrated circuit (ROIC) (not illustrated) inside the base substrate 11. The infrared sensor 1A further includes a first signal readout terminal 22A and a second signal readout terminal 22B on the upper surface 14 of the base substrate 11. The first prop 15A and the ROIC are electrically connected to each other via the first signal readout terminal 22A. The second prop 15B and the ROIC are electrically connected to each other via the second signal readout terminal 22B. The resistance of the resistance change portion 18 can be read out via the first beam 13A, the second beam 13B, the first prop 15A, the second prop 15B, the first signal readout terminal 22A, and the second signal readout terminal 22B. Note that the electrical resistance between the first signal readout terminal 22A and the second signal readout terminal 22B between which the resistance change portion 18 is positioned is the foregoing total electric resistance Ran. The infrared sensor 1A may further include members for reading out the resistance of the resistance change portion 18.

When infrared light is incident on the infrared receiver 12, the temperature of the infrared receiver 12 increases. In this process, the more thermally insulated the infrared receiver 12 is from the base substrate 11, which serves as a heat bath, and the members on the base substrate 11, the more the temperature of the infrared receiver 12 increases. In the infrared sensor 1A including the bolometer infrared receiver 12, as the temperature increases, the resistance of the resistance change portion 18 included in the infrared receiver 12 changes. An electrical signal corresponding to the changed resistance is processed in the ROIC, and thus the infrared light is detected. Depending on the processing, the intensity of infrared light and/or the temperature of the target object can be measured with the infrared sensor 1A. Here, as for the infrared sensor of the present disclosure, the way of reading out the resistance of the resistance change portion 18 included in the infrared receiver 12 is not limited to methods using the ROIC provided inside the base substrate 11.

In the infrared sensor 1A illustrated in FIGS. 1A and 1B, the portion at which the first and second beams 13A and 13B and the infrared receiver 12 are physically joined and the portion at which and the first and second beams 13A and 13B and the resistance change portion 18 are electrically connected are the same. Specifically, the boundary between the resistance change portion 18 and the first beam 13A and the boundary between the resistance change portion 18 and the second beam 13B are the foregoing physically joined portions and also the foregoing electrically connected portions. However, in the infrared sensor of the present disclosure, the foregoing physically joined portions and the foregoing electrically connected portions may be different.

The infrared sensor 1A illustrated in FIGS. 1A and 1B further includes an infrared reflection film 23 on the surface of the base substrate 11 at a position facing the infrared receiver 12. This configuration allows infrared light reflected on the infrared reflection film 23 to be used, making it possible to further improve the light receiving sensitivity of the infrared sensor 1A. For the infrared sensor 1A illustrated in FIGS. 1A and 1B, the infrared reflection film 23 is disposed on the upper surface 14 of the base substrate 11. In plan view, the area of the infrared reflection film 23 is larger than that of the infrared receiver 12. In addition, in plan view, the infrared reflection film 23 is disposed to surround the infrared receiver 12. However, the concrete configuration of the infrared reflection film 23 is not limited to the example illustrated in FIGS. 1A and 1B. The infrared reflection film 23 has a thickness, for example, larger than or equal to 50 nm and smaller than or equal to 500 nm. The infrared sensor of the present disclosure does not have to include an infrared reflection film 23. Note that the term "plan view" in this specification means viewing a target object from a direction perpendicular to the main face of the target object. Here, the term "main face" means the face having the largest area.

The base substrate 11 typically includes a semiconductor. The semiconductor is, for example, Si. The upper surface 14 of the base substrate 11 including Si may have an oxide film on it. The oxide film is, for example, a silicon oxide ($SiO_2$) film. However, the configuration of the base substrate 11 is not limited to the above example.

The first prop 15A, the second prop 15B, the first signal readout terminal 22A, and the second signal readout terminal 22B include, for example, semiconductors doped with impurities, or metals. Examples of the metals include ones having low thermal conductivity such as titanium (Ti) and titanium nitride (TiN). However, the materials included in the first prop 15A, the second prop 15B, and the signal readout terminals 22A and 22B are not limited to the above examples.

The ROIC may have a known configuration. The ROIC may be provided at a place different from the inside of the base substrate 11. The ROIC may be provided, for example, on the upper surface 14 of the base substrate 11.

The infrared reflection film 23 typically includes a metal. Examples of the metal include chromium (Cr), aluminum (Al), and gold (Au). However, the material included in the infrared reflection film 23 is not limited to the above examples.

The section of the first beam 13A between the joint portion with the infrared receiver 12 and the connection portion 16A and/or the section of the second beam 13B between the joint portion with the infrared receiver 12 and the connection portion 16B may have a phononic crystal structure including a plurality of orderly arranged through holes. In the example of the infrared sensor 1A of embodiment 1, the section of the first beam 13A between the joint portion with the infrared receiver 12 and the connection portion 16A has a first phononic crystal structure having a plurality of orderly arranged through holes, and the section of the second beam 13B between the joint portion with the infrared receiver 12 and the connection portion 16B has a second phononic crystal structure having a plurality of orderly arranged through holes. Those sections are typically positioned at the separated portion 17 of the first beam 13A and/or the separated portion 17 of the second beam 13B.

In nonconductors and semiconductors, heat is mainly carried by lattice vibrations called phonons. The thermal conductivity of a material including a nonconductor or a semiconductor is determined by the dispersion relation of phonons that the material has. The dispersion relation of phonons means the relationship between the frequency and the number of waves or means the band structure. In a nonconductor and a semiconductor, phonons that carries heat have frequencies in a wide frequency band from 100 GHz to 10 THz. This frequency band is a thermal band. The thermal conductivity of a material is determined by the dispersion relation of phonons in the thermal band.

For the phononic crystal structure, the dispersion relation of phonons that a material has can be controlled by the structure of the through-hole pitch. In other words, for the phononic crystal structure, the thermal conductivity itself of a material can be controlled. In particular, forming a phononic band gap (PBG) of the phononic crystal structure can greatly decrease the thermal conductivity of a material. There cannot be phonons in a PBG. Hence, a PBG positioned in the thermal band can be a gap of heat conduction. In addition, also in frequency bands other than the PBG, the slope of the phonon dispersion curve is decreased due to the PBG. The decrease in the slope reduces the group velocity of phonons and reduces the heat conduction speed. These points greatly contribute to the reduction of the thermal conductivity of the material. The thermal conductivity of a material can be reduced, for example, by porosification. This is because the pores formed by porosification reduce the thermal conductivity of the material. However, the phononic crystal structure can reduce the thermal conductivity of a material itself. Hence, it is expected that the thermal conductivity can be further reduced compared to the simple porosification.

As can be understood from the above explanation, the first beam 13A and the second beam 13B having a section having a phononic crystal structure can further decrease their thermal conductivities. Thus, in the case where the first beam 13A and/or the second beam 13B, in particular, both the first beam 13A and the second beam 13B, have a phononic crystal structure in the above sections, it is possible to further improve the thermal insulation between the base substrate 11 and the infrared receiver 12 in the infrared sensor 1A. The further improved thermal insulation makes it possible to improve the light receiving sensitivity of the infrared sensor 1A.

The following description concerns a phononic crystal structure that the first beam 13A and/or the second beam 13B can have. Hereinafter, the phononic crystal structure that the first beam 13A and/or the second beam 13B can have is referred to as the phononic crystal structure A.

Figure 2A:
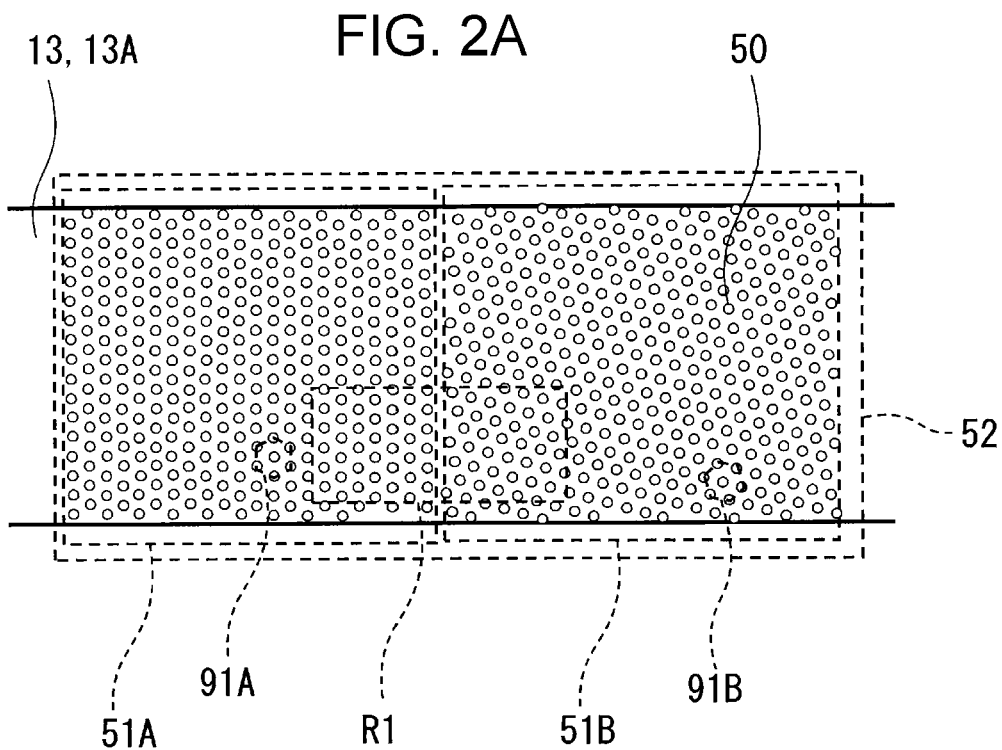
FIG. 2A is a schematic plan view of an example of a phononic crystal structure that a beam (first beam) of the infrared sensor of the present disclosure can have.
Figure 2B:
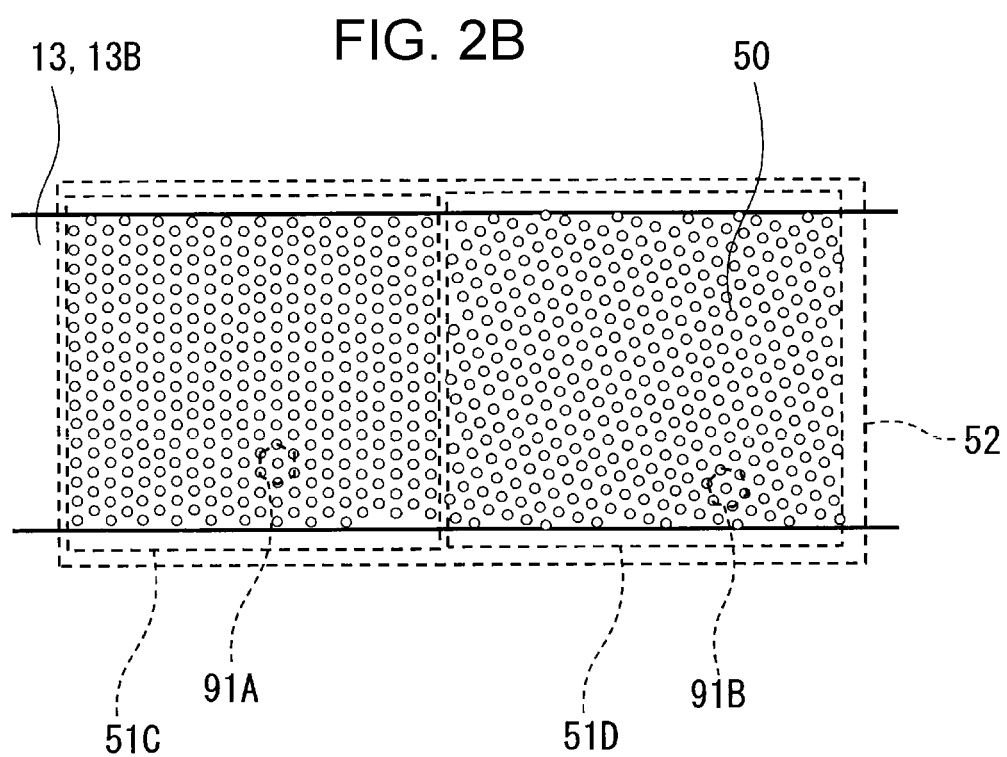
FIG. 2B is a schematic plan view of an example of a phononic crystal structure that a beam (second beam) of the infrared sensor of the present disclosure can have.

An example of the phononic crystal structure A is illustrated in FIGS. 2A and 2B. FIG. 2A illustrates part of the beam 13 (13A) in plan view. FIG. 2B illustrates part of the beam 13 (13B) in plan view. The beam 13 (13A, 13B) has a thickness, for example, larger than or equal to 10 nm and smaller than or equal to 500 nm. The beam 13 is rectangular in plan view. The long sides of the beam 13 are aligned with the direction of connecting the infrared receiver 12 and the connection portion 16A or 16B, in other words, are aligned with the macroscopic heat transfer direction of the infrared sensor 1A. The beam 13 has a plurality of through holes 50 extending in the thickness direction of the beam 13. The phononic crystal structure A that the beam 13 has is a two-dimensional phononic crystal structure in which the through holes 50 are orderly arranged in the in-plane direction.

The phononic crystal structure A of the first beam 13A has a first domain 51A which is a phononic crystal region and a second domain 51B which is a phononic crystal region. The first domain 51A has a phononic single crystal structure having a plurality of through holes 50 orderly arranged in a first direction in plan view. The second domain 51B has a phononic single crystal structure having a plurality of through holes 50 orderly arranged in a second direction different from the first direction in plan view. In each single crystal structure, the diameters of the through holes 50 and their arrangement pitch are the same. In addition, in each single crystal structure, the orientations of the unit lattices 91A or 91B including a plurality of orderly arranged through holes 50 are the same. The shapes of the first domain 51A and the second domain 51B are rectangular in plan view. The shape of the first domain 51A and the shape of the second domain 51B are the same in plan view.

The phononic crystal structure A of the second beam 13B has a third domain 51C which is a phononic crystal region and a fourth domain 51D which is a phononic crystal region. The third domain 51C has a phononic single crystal structure having a plurality of through holes 50 orderly arranged in a third direction in plan view. The fourth domain 51D has a phononic single crystal structure having a plurality of through holes 50 orderly arranged in a fourth direction different from the third direction in plan view. In each single crystal structure, the diameters of the through holes 50 and their arrangement pitch are the same. In addition, in each single crystal structure, the orientations of the unit lattices 91A or 91B including a plurality of orderly arranged through holes 50 are the same. The shapes of the third domain 51C and the fourth domain 51D are rectangular in plan view. The shape of the third domain 51C and the shape of the fourth domain 51D are the same in plan view.

The phononic crystal structure A illustrated in FIGS. 2A and 2B is also a phononic polycrystalline structure 52 which is a composite of phononic single crystal structures.

The phononic crystal structure A illustrated in FIG. 2A and the phononic crystal structure A illustrated in FIG. 2B are the same. However, these structures may be different.

The phononic crystal structure A that the first beam 13A can have and the phononic crystal structure A that the second beam 13B can have may be the same or may be different from each other.

Hereinafter, description will be made of details of the configuration that the phononic crystal structure A can have, based on an example of the phononic crystal structure A that the first beam 13A can have, in other words, an example of the phononic crystal structure A that has the first domain 51A and the second domain 51B. The phononic crystal structure A that the second beam 13B can have may be of the same or a similar configuration. The phononic crystal structure A that the first beam 13A can have and the phononic crystal structure A that the second beam 13B can have may be different within the range of the configuration described below.

The domain of the phononic crystal region is a region, for example, having the area larger than or equal to 25P2 in plan view where P is the arrangement pitch of the through holes 50. To control the dispersion relation of phonons by means of the phononic crystal structure, a domain may have at least the area larger than or equal to 25P2. In the case of a square domain in plan view, the area larger than or equal to 25P2 can be achieved by setting it to 5×P (pitch) or more.

Figure 3A:
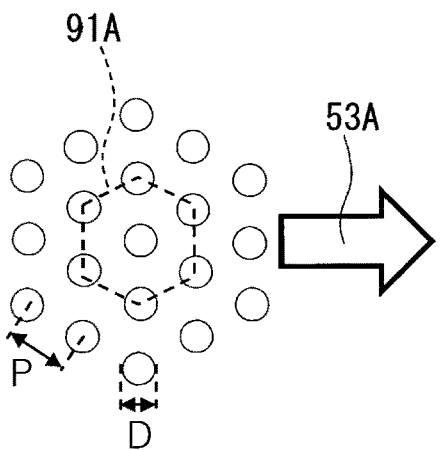
FIG. 3A is a schematic diagram illustrating a unit lattice and its orientation in a first domain included in the phononic crystal structure in FIG. 2A.
Figure 3B:
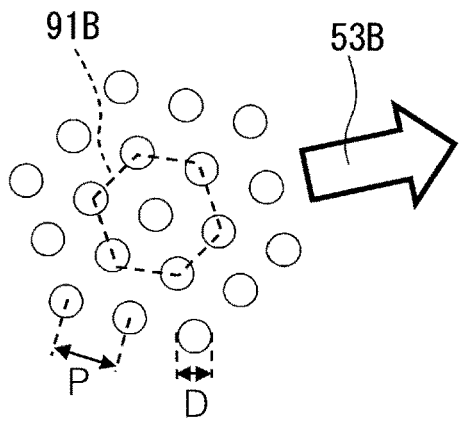
FIG. 3B is a schematic diagram illustrating a unit lattice and its orientation in a second domain included in the phononic crystal structure in FIG. 2A.

As illustrated in FIGS. 3A and 3B, in the phononic crystal structure A, an orientation 53A of the unit lattice 91A in the first domain 51A and an orientation 53B of the unit lattice 91B in the second domain 51B are different from each other in plan view. The angle formed by the orientation 53A and the orientation 53B is, for example, larger than or equal to 10 degrees in plan view. Here, in the case where the unit lattice 91A and the unit lattice 91B are the same and have n-fold rotational symmetry, the maximum angle formed by the orientation 53A and the orientation 53B is smaller than 360/n degrees. In the case where the unit lattice has n-fold rotational symmetry and n can take two or more numbers, the largest n is used to determine the above maximum angle. For example, a hexagonal lattice has two-fold rotational symmetry, three-fold rotational symmetry, and six-fold rotational symmetry. In this case, "6" is used as "n" to determine the maximum angle. Specifically, for the unit lattices 91A and 91B which are hexagonal lattices, the angle formed by the orientation 53A and the orientation 53B is smaller than 60 degrees. The phononic crystal structure A has at least two or more phononic crystal regions each having a different orientation of the unit lattice. As long as this condition is satisfied, the phononic crystal structure A may further include any phononic crystal region and/or a region not having a phononic crystal structure.

The orientation of the unit lattice can be determined based on an appropriate rule. However, the same rule needs to be applied for different domains to determine the orientations of the unit lattices. The orientation of the unit lattice is, for example, an extending direction of the straight line that bisects the angle formed by two sides of the unit lattice not in parallel with each other. In this case, the two sides need to be determined under the same rule between the different domains.

Figure 4:
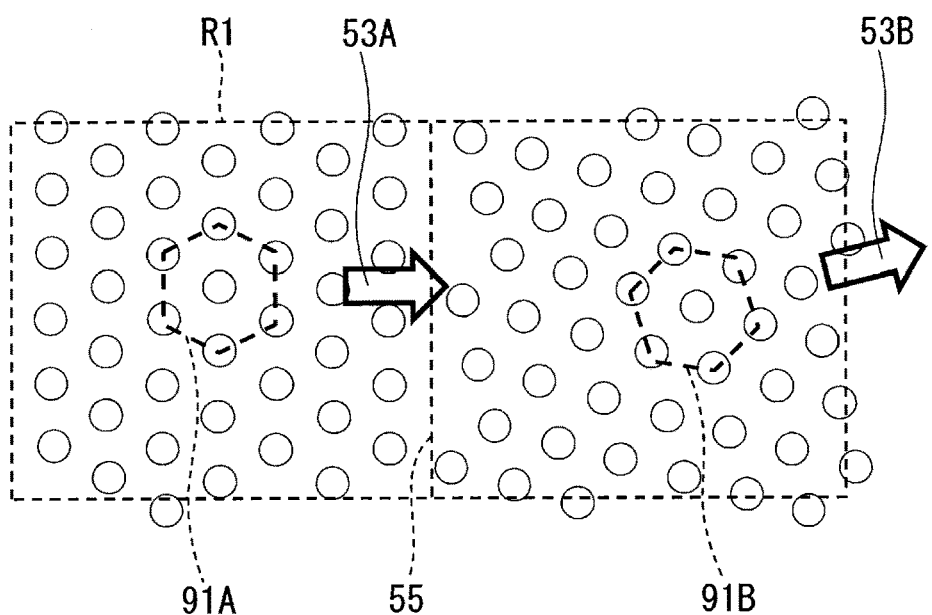
FIG. 4 is an enlarged view of a region in the phononic crystal structure in FIG. 2A.

FIG. 4 illustrates an enlarged view of a region R1 of the phononic crystal structure A in FIG. 2A. The orientations 53A and 53B of the unit lattices 91A and 91B are changed at the interface 55 between the adjoining first domain 51A and second domain 51B. The interface 55 at which the orientation of the unit lattice is changed provides a large interface resistance to the heat that flows through the phononic crystal structure A macroscopically. This interface resistance is based on a mismatch between the phonon group velocities of the first domain 51A and the second domain 51B. This interface resistance contributes to reduction of the thermal conductivity of the beam 13 (13A) having the phononic crystal structure A. In FIG. 4, the interface 55 extends in the form of a straight line in plan view. In addition, the interface 55 extends in the width direction of the rectangular beam 13 in plan view. The width direction can be a direction perpendicular to the extending direction of the center line of the beam 13 determined by the macroscopic heat transfer direction. The interface 55 divides the phononic crystal structure A in a direction perpendicular to the macroscopic heat transfer direction in plan view.

In the phononic crystal structure A in FIG. 2A, an arrangement pitch P of the through holes 50 in the first domain 51A and the arrangement pitch P of the through holes 50 in the second domain 51B are the same.

In the phononic crystal structure A in FIG. 2A, the diameter of the through holes 50 orderly arranged in the first domain 51A and the diameter of the through holes 50 orderly arranged in the second domain 51B are the same.

In the phononic crystal structure A in FIG. 2A, the type of the unit lattice 91A in the first domain 51A and the type of the unit lattice 91B in the second domain 51B are the same. The unit lattice 91A and the unit lattice 91B in FIG. 2A are both hexagonal lattices.

The shape of each domain in plan view is not limited to any specific ones. The shape of each domain in plan view is, for example, a polygon including a triangle, a square, and a rectangle, a circle, an ellipse, and a combination of these shapes. The shape of each domain in plan view may be an indeterminate shape. The number of domains that the phononic crystal structure A has is not limited to any specific ones. The more the number of domains that the phononic crystal structure A has, the larger the effect of the interface resistances of the interfaces between the domains. Further, the size of each domain that the phononic crystal structure A has is not limited to any specific ones.

Figure 5:
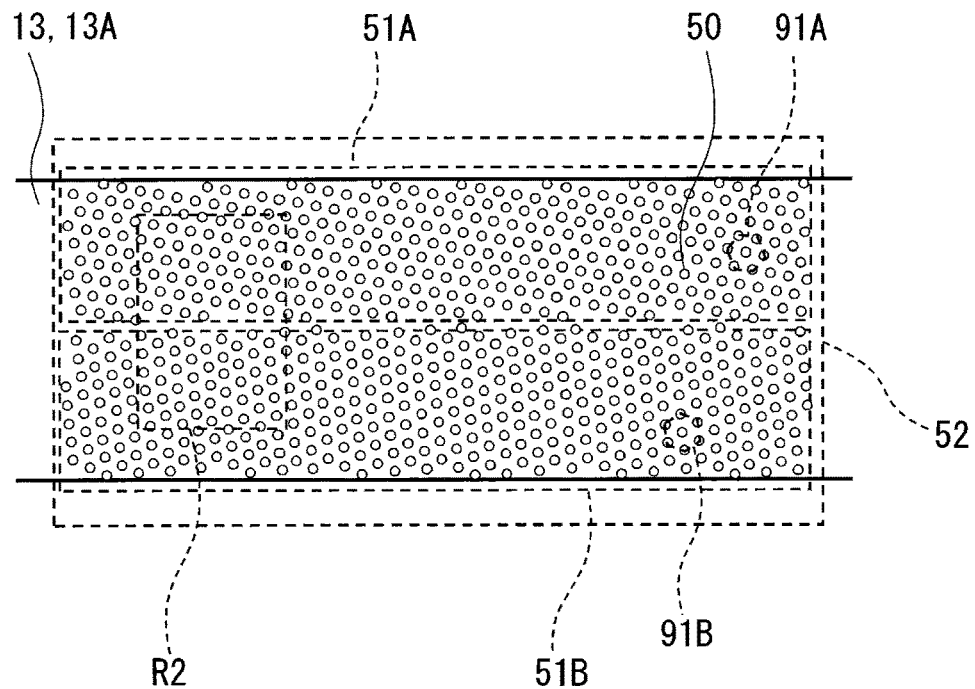
FIG. 5 is a schematic plan view of another example of a phononic crystal structure that the beam of the infrared sensor of the present disclosure can have.
Figure 6:
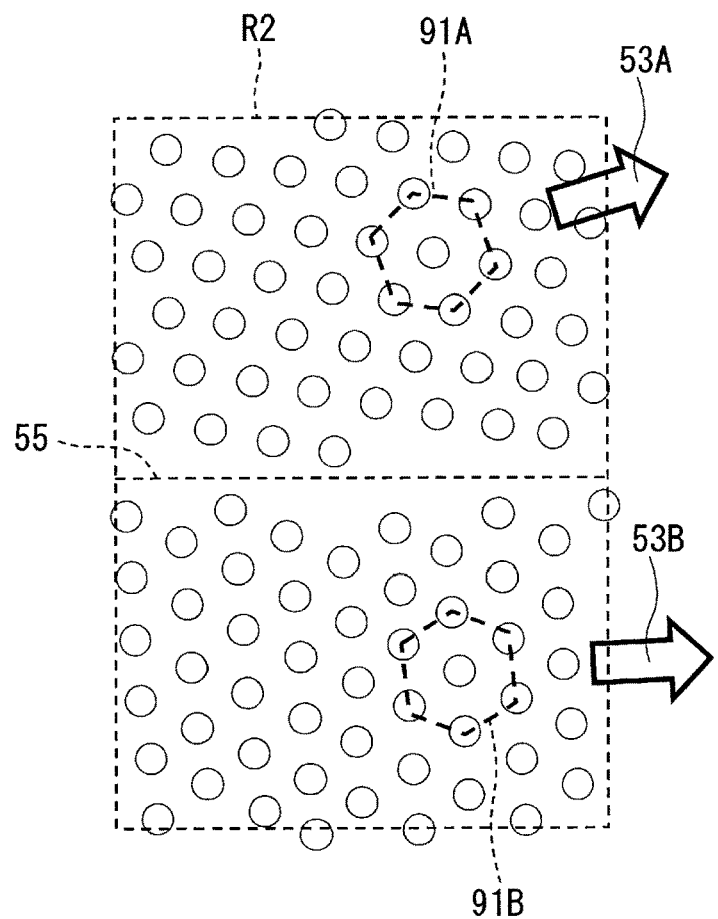
FIG. 6 is an enlarged view of a region in the phononic crystal structure in FIG. 5.

The phononic crystal structure A illustrated in FIGS. 5 and 6 is a polycrystalline structure 52. In the polycrystalline structure 52, the interface 55 between the adjoining first domain 51A and second domain 51B extends in the direction of the long sides of a rectangle beam 13 (13A) in plan view. The direction of the long sides can be the macroscopic heat transfer direction. Except for this point, the phononic crystal structure A in FIGS. 5 and 6 has a configuration the same as or similar to that of the phononic crystal structure A in FIG. 2A. The interface 55 divides the phononic crystal structure A in a direction in parallel with the macroscopic heat transfer direction in plan view. FIG. 6 is an enlarged view of a region R2 in FIG. 5.

In the phononic crystal structures A in FIGS. 2A and 5, the sizes of the first domain 51A and the second domain 51B are the same in plan view. However, the sizes of the first domain 51A and the second domain 51B that the phononic structure A has may be different from each other in plan view.

Figure 7:
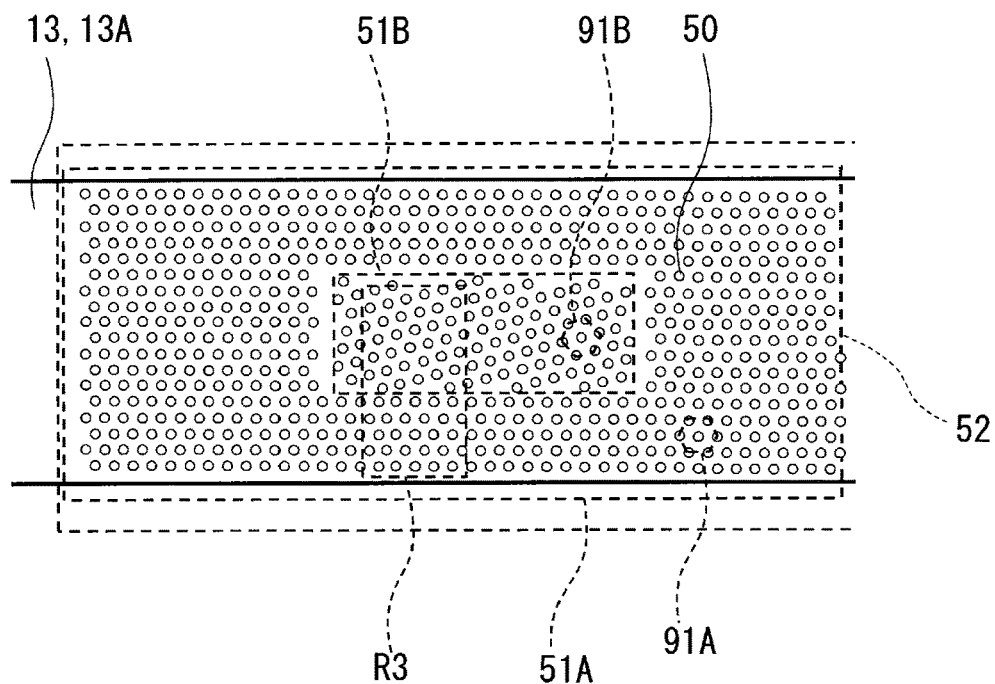
FIG. 7 is a schematic plan view of still another example of a phononic crystal structure that the beam of the infrared sensor of the present disclosure can have.
Figure 8:
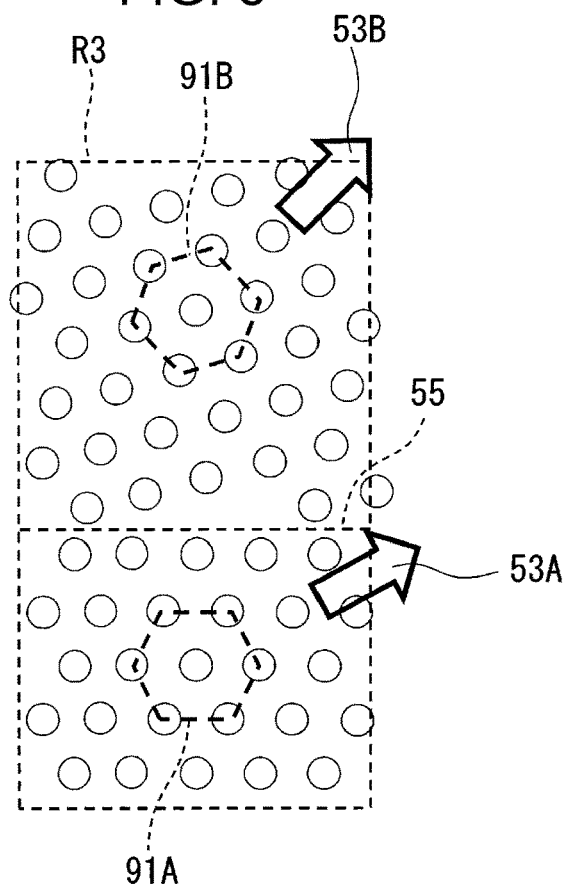
FIG. 8 is an enlarged view of a region in the phononic crystal structure in FIG. 7.

The phononic crystal structure A illustrated in FIGS. 7 and 8 is a polycrystalline structure 52. In the polycrystalline structure 52, the second domain 51B is surrounded by the first domain 51A in plan view. The shapes of the first domain 51A and the second domain 51B are rectangular in plan view. However, the size of the first domain 51A and the size of the second domain 51B are different in plan view. The interface 55 between the second domain 51B and the first domain 51A surrounding the second domain 51B forms the outer edges of the second domain 51B in plan view. Except for these points, the phononic crystal structure A in FIGS. 7 and 8 has a configuration the same as or similar to that of the phononic crystal structure A in FIG. 2A. FIG. 8 is an enlarged view of a region R3 in FIG. 7.

In the phononic crystal structure A in FIGS. 7 and 8, the interface 55 has corner portions.

In addition, the second domain 51B in the phononic crystal structure A in FIGS. 7 and 8 does not adjoin any side of the beam 13 (13A).

The phononic crystal structure A illustrated in FIG. 9 is a polycrystalline structure 52. The polycrystalline structure 52 has a first domain 51A and a second domain 51B which are apart from each other in plan view. More specifically, the polycrystalline structure 52 has, in plan view, a region 201 having no through hole 50 between the first domain 51A and the second domain 51B in the long side direction of the beam 13 (13A). Except for this point, the phononic crystal structure A in FIG. 9 has a configuration the same as or similar to that of the phononic crystal structure A in FIG. 2A.

The phononic crystal structure A illustrated in FIG. 10 is a polycrystalline structure 52. The polycrystalline structure 52 has a first domain 51A and a second domain 51B which are apart from each other in plan view. More specifically, the polycrystalline structure 52 has, in plan view, a region 202 having randomly arranged through holes 50 between the first domain 51A and the second domain 51B in the long side direction of the beam 13 (13A). In the region 202, the through holes 50 are not orderly arranged in plan view. Alternatively, in the region 202, the area of a region where through holes are orderly arranged is, for example, smaller than $25P^2$ in plan view. Here, P is the arrangement pitch of the through holes 50. Except for this point, the phononic crystal structure A in FIG. 10 has a configuration the same as or similar to that of the phononic crystal structure A in FIG. 2A.

Figure 11:
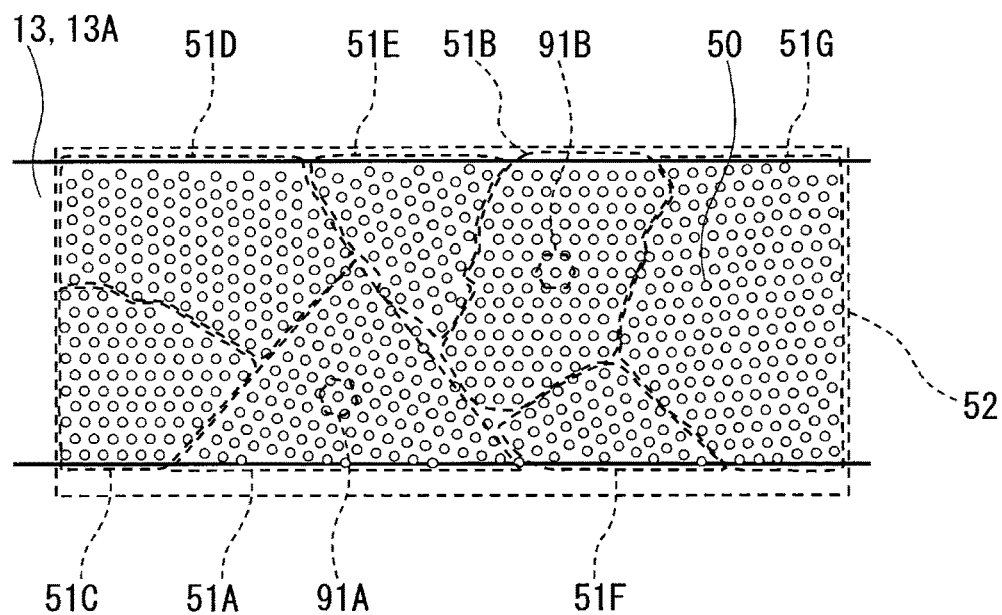
FIG. 11 is a schematic plan view of an example, which is different from the above examples, of a phononic crystal structure that the beam of the infrared sensor of the present disclosure can have.

The phononic crystal structure A illustrated in FIG. 11 is a polycrystalline structure 52. The polycrystalline structure 52 includes a plurality of domains 51A, 51B, 51C, 51D, 51E, 51F, and 51G each having a different shape in plan view. Within each domain, the arrangement pitch of the through holes 50 and the orientation of each unit lattice are the same. However, the orientation of the unit lattices in each of the domains 51A to 51G is different from one another. The size and shape of each of the domains 51A to 51G are different from one another in plan view. This configuration has a larger number of kinds in the orientation of the unit lattice as the whole of the phononic crystal structure A than the other configurations that have been described up to this point. Thus, the effect to reduce the thermal conductivity on the basis of the difference in the orientation of the unit lattice between domains is greater. Also, in this configuration, the interfaces 55 between the domains extend in plural random directions in plan view. This configuration makes the effect to reduce the thermal conductivity on the basis of the interface resistance greater.

In the phononic crystal structure A in FIG. 11, the interface 55 between the adjoining first domain 51A and second domain 51B extends in a direction inclined from the width direction of the beam 13 (13A) in plan view. The interfaces 55 also have corner portions in plan view.

Figure 12A:
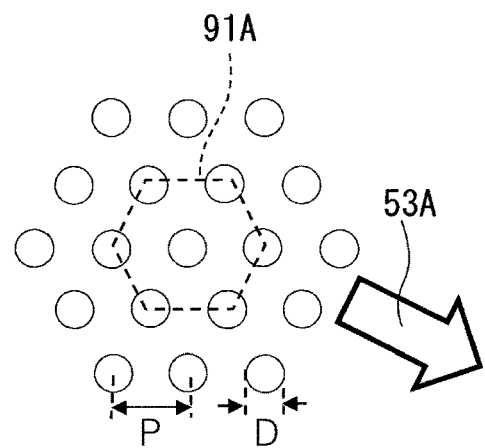
FIG. 12A is a schematic diagram illustrating an example of a unit lattice of a phononic crystal structure that the beam of the infrared sensor of the present disclosure can have.
Figure 12B:
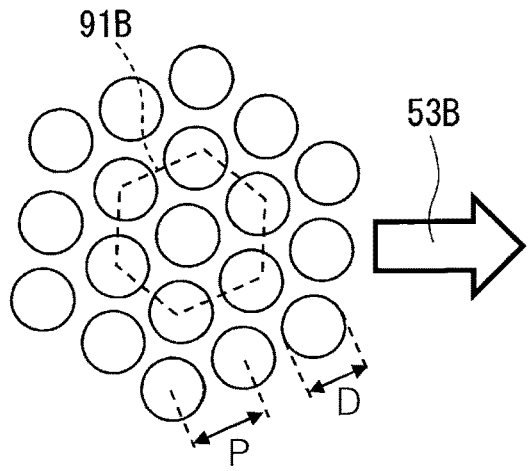
FIG. 12B is a schematic diagram illustrating another example of a unit lattice of a phononic crystal structure that the beam of the infrared sensor of the present disclosure can have.

The polycrystalline structure 52 which is the phononic crystal structure A may include the first domain 51A and the second domain 51B each having a different arrangement pitch P of the through holes 50 and/or a different diameter D of the through holes 50. The diameter D of the through holes 50 in the first domain 51A illustrated in FIG. 12A and the diameter D of the through holes 50 in the second domain 51B illustrated in FIG. 12B are different from each other. The arrangement pitch P of the through holes 50 in the first domain 51A illustrated in FIG. 12A and the arrangement pitch P of the through holes 50 in the second domain 51B illustrated in FIG. 12B are the same.

Figure 13:
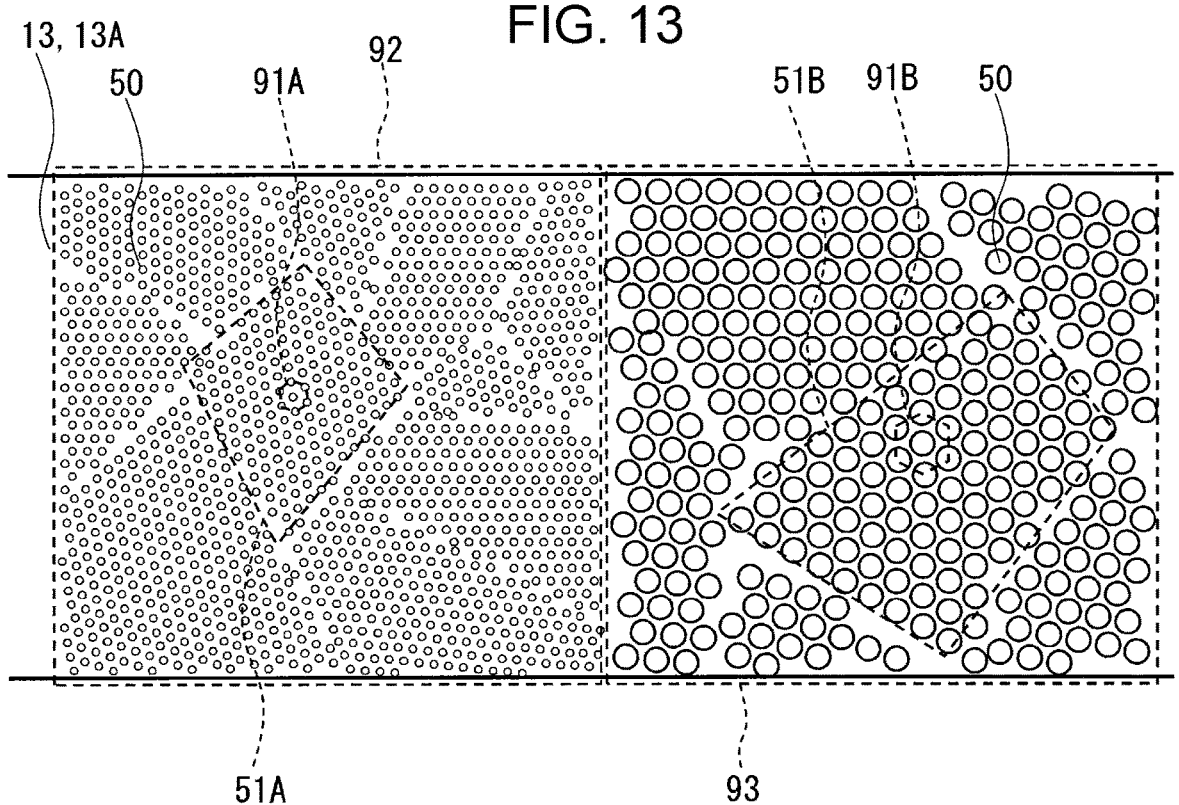
FIG. 13 is a schematic plan view of an example, which is different from the above examples, of a phononic crystal structure that the beam of the infrared sensor of the present disclosure can have.

The phononic crystal structure A illustrated in FIG. 13 has a first domain 51A in which a plurality of through holes 50 having a relatively small pitch P and diameter D are orderly arranged and a second domain 51B in which a plurality of through holes 50 having a relatively large pitch P and diameter D are orderly arranged. The phononic crystal structure A in FIG. 13 has a region 92 including a plurality of through holes 50 having a relatively small pitch P and diameter D and a region 93 including a plurality of through holes 50 having a relatively large pitch P and diameter D. The region 92 and the region 93 adjoin each other. The region 92 and the region 93, as in the example of FIG. 11, each include a plurality of domains each having a different shape and a different orientation of unit lattices in plan view. The region 92 and the region 93 are obtained by dividing the phononic crystal structure A in a direction perpendicular to the macroscopic heat transfer direction. In this configuration, the frequency band of the phononic band gap formed in the first domain 51A and the frequency band of the phononic band gap formed in the second domain 51B are different, and thus the effect to reduce thermal conductivity is particularly large.

Figure 14:
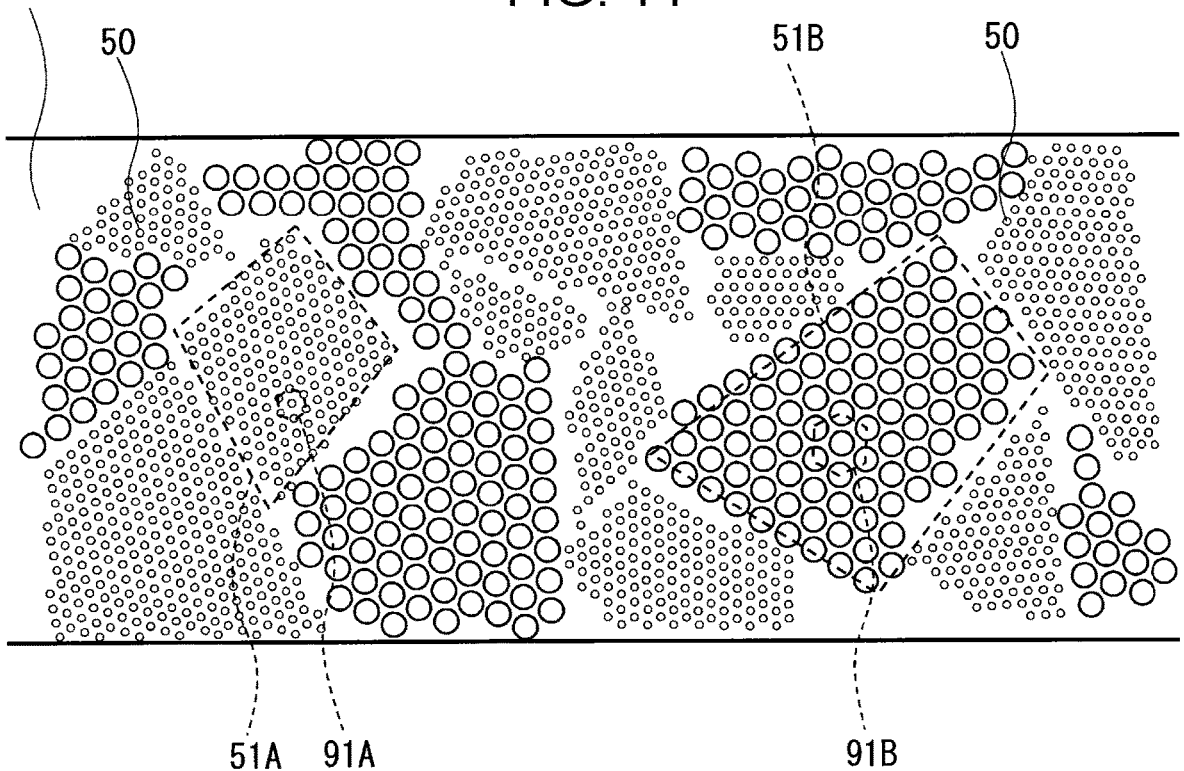
FIG. 14 is a schematic plan view of an example, which is different from the above examples, of a phononic crystal structure that the beam of the infrared sensor of the present disclosure can have.

The phononic crystal structure A illustrated in FIG. 14 has a first domain 51A in which a plurality of through holes 50 having a relatively small interval P and diameter D are orderly arranged and a second domain 51B in which a plurality of through holes 50 having a relatively large interval P and diameter D are orderly arranged. The phononic crystal structure A in FIG. 14 has a plurality of domains each having a different shape and a different orientation of unit lattices in plan view. In this configuration, the frequency band of the phononic band gap formed in the first domain 51A and the frequency band of the phononic band gap formed in the second domain 51B are different, and thus the effect to reduce thermal conductivity is particularly large.

The arrangement pitch P of the through holes 50 is, for example, larger than or equal to 1 nm and smaller than or equal to 300 nm. This is because the wavelengths of phonons which carry heat range from 1 nm to 300 nm. The pitch P is determined by the distance between the centers of adjoining through holes 50 in plan view (see FIGS. 12A and 12B).

The diameter D of the through holes 50 can be expressed by D/P, which the ratio relative to the pitch P, and is, for example, $D/P \geq 0.5$. In the case where the ratio $D/P<0.5$, the porosity in the beam 13 (13A, 13B) is excessively low, and thus the thermal conductivity may not be sufficiently low. The upper limit of the ratio D/P is, for example, smaller than 0.9 so that adjoining through holes 50 will not be in contact with one another. The diameter D means the diameter of the opening of the through hole 50. In the case where the shape of the opening of the through hole 50 is a circle in plan view, the diameter D is the diameter of the circle. The shape of the opening of the through hole 50 does not have to be a circle in plan view. In this case, the diameter D is determined by the diameter of the imaginary circle having the same area as the opening (see FIGS. 12A and 12B).

Figure 15A:
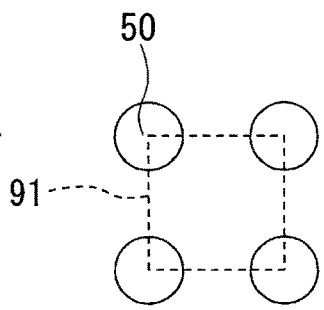
FIG. 15A is a schematic diagram illustrating an example of a unit lattice of a phononic crystal structure that the beam of the infrared sensor of the present disclosure can have.
Figure 15B:
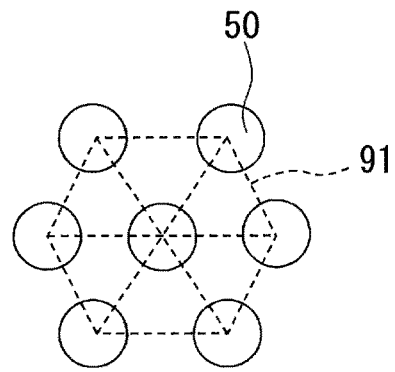
FIG. 15B is a schematic diagram illustrating another example of a unit lattice of a phononic crystal structure that the beam of the infrared sensor of the present disclosure can have.
Figure 15C:
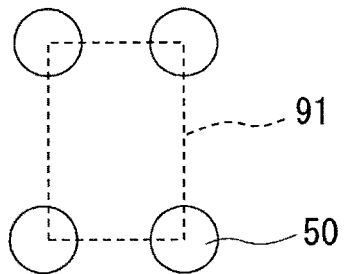
FIG. 15C is a schematic diagram illustrating still another example of a unit lattice of a phononic crystal structure that the beam of the infrared sensor of the present disclosure can have.
Figure 15D:
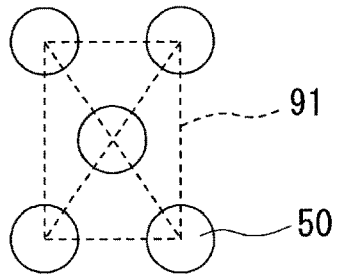
FIG. 15D is a schematic diagram illustrating an example, which is different from the above examples, of a unit lattice of a phononic crystal structure that the beam of the infrared sensor of the present disclosure can have.

Examples of the type of the unit lattice 91 including a plurality of orderly arranged through holes 50 include a square lattice (FIG. 15A), a hexagonal lattice (FIG. 15B), a rectangular lattice (FIG. 15C), and a centered rectangular lattice (FIG. 15D). However, the type of the unit lattice 91 is not limited to these examples.

The phononic crystal structure A that the first beam 13A and/or the second beam 13B can have is not limited to the foregoing structures. The phononic crystal structure A may be, for example, the structure disclosed in Japanese Unexamined Patent Application Publication No. 2017-223644.

However, the phononic crystal structure A having two or more phononic crystal regions each having a different orientation of unit lattices, illustrated in the foregoing figures such as FIGS. 2A and 2B, enables a further reduction of the thermal conductivity of the beam 13, in other words, a further improvement in the heat insulation property. The reasons are as follows.

According to the study by the inventors, the degree of the reduction of thermal conductivity achieved by a phononic crystal structure is dependent on the angle formed by the heat transfer direction and the orientation of the unit lattices in the phononic crystal structure. The reason is probably that the factors related to heat conduction, such as the bandwidth of the PBG, the number of PBGs, and the average group velocity of phonons, are dependent on the angle. As for heat transfer, phonons flow macroscopically in a direction from a high temperature part toward a low temperature part. However, when focusing attention on micro regions on the order of nanometers, no directivity can be seen in the directions of phonon flows. In other words, the directions of phonon flows are not uniform microscopically. In the phononic crystal structure A having a plurality of phononic crystal regions in which the orientations of the unit lattices are uniformly aligned between the regions, the interactions are largest for phonons that flow in a specific direction, but the interaction is small for phonons that flow in other directions, from a microscopic point of view. However, in the phononic crystal structure A having two or more phononic crystal regions in which the orientations of the unit lattices are different between the regions, the interactions can be increased for phonons flowing different directions, from a microscopic point of view. This enables a further reduction of the thermal conductivity of the beam 13.

Embodiment 2

Figure 16A:
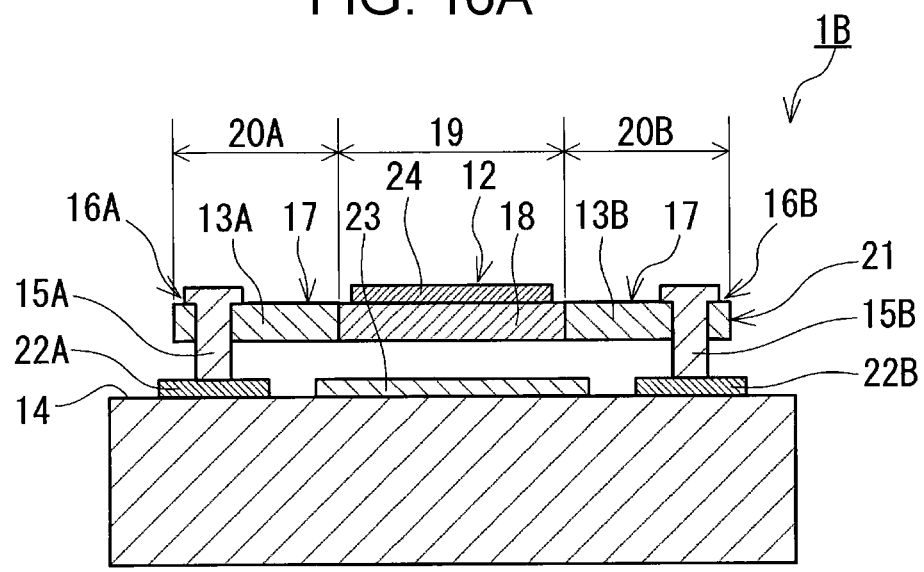
FIG. 16A is a schematic cross-sectional view of an infrared sensor of embodiment 2.
Figure 16B:
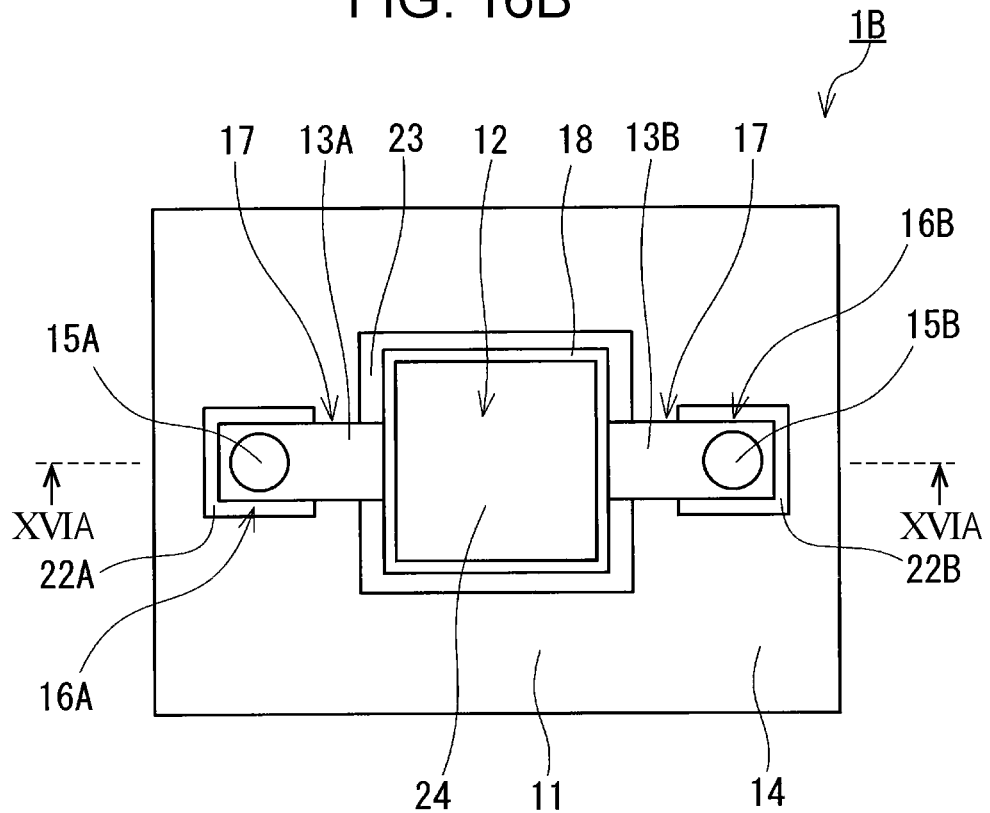
FIG. 16B is a schematic plan view of the infrared sensor of embodiment 2.

An infrared sensor of embodiment 2 is illustrated in FIGS. 16A and 16B. FIG. 16A illustrates a cross-sectional view of an infrared sensor 1B taken along line XVIA-XVIA in FIG. 16B. The infrared sensor 1B is a bolometer infrared sensor which is a type of a thermal infrared sensor.

The infrared receiver 12 of the infrared sensor 1B further includes an infrared absorbing layer 24. The infrared absorbing layer 24 is disposed on the resistance change portion 18. This configuration further improves the light receiving sensitivity of the infrared sensor 1B. Note that the infrared absorbing layer 24 included in the infrared sensor 1B of embodiment 2 is directly in contact with the resistance change portion 18. The area of the infrared absorbing layer 24 is smaller than the area of the resistance change portion 18 in plan view. The infrared absorbing layer 24 is disposed to be surrounded by the resistance change portion 18 in plan view. However, the concrete configuration of the infrared absorbing layer 24 is not limited to the example illustrated in FIGS. 16A and 16B.

Figure 17A:
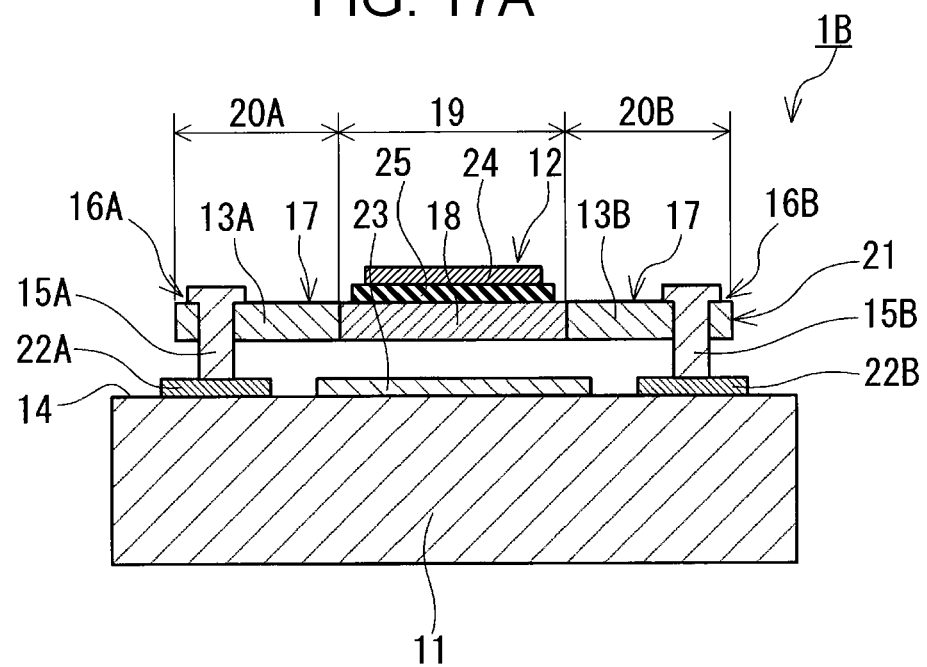
FIG. 17A is a schematic cross-sectional view of a modification example of the infrared sensor of embodiment 2.
Figure 17B:
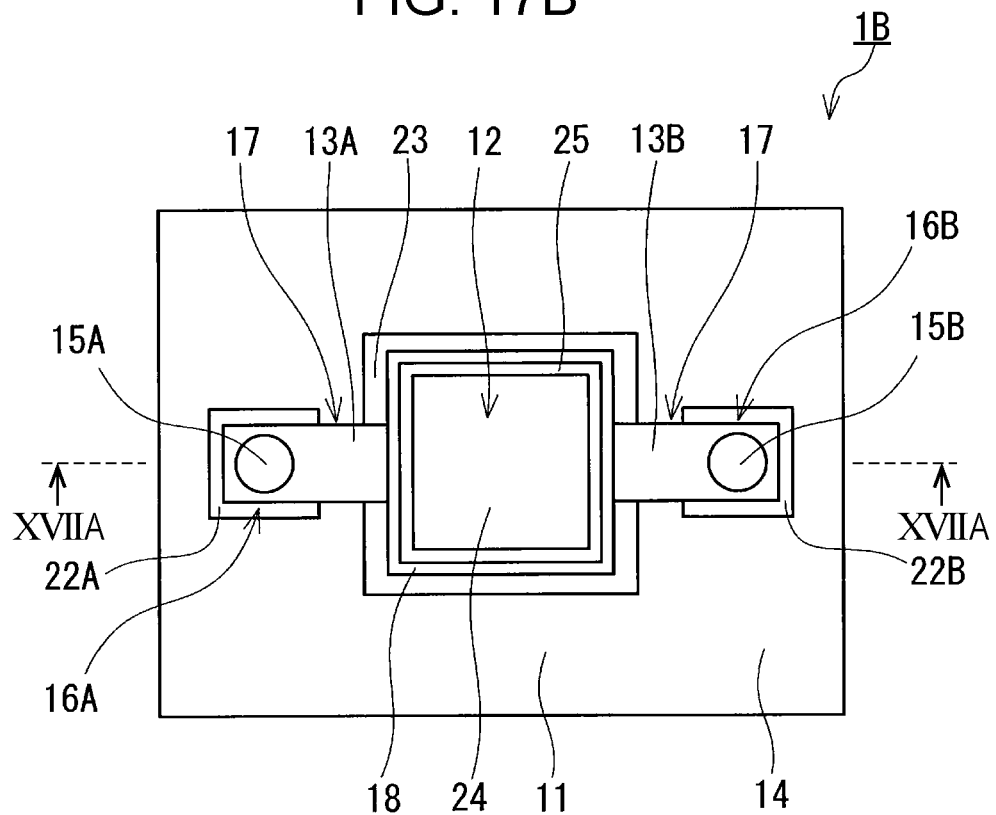
FIG. 17B is a schematic plan view of the modification example of the infrared sensor of embodiment 2.

The material included in the infrared absorbing layer 24 is, for example, a metal such as Ti, Cr, Au, Al, and copper (Cu), an oxide such as $SiO_2$, a nitride such as TiN and silicon nitride (SiN). The material included in the infrared absorbing layer 24 is not limited to the above examples. In the case where the infrared absorbing layer 24 is electrically conductive, it is desirable as illustrated in FIGS. 17A and 17B that an insulation layer 25 be disposed between the resistance change portion 18 and the infrared absorbing layer 24. The material included in the insulation layer 25 is, for example, an oxide such as $SiO_2$. However, the material included in the insulation layer 25 is not limited to the above example. In the case where the infrared receiver 12 includes an insulation layer 25, the infrared receiver 12 has the resistance change portion 18, the insulation layer 25, and the infrared absorbing layer 24. The insulation layer 25 and the infrared absorbing layer 24 are stacked on the resistance change portion 18 in this order. Note that FIG. 17A is a cross sectional view of the infrared sensor 1B taken along line XVIIA-XVIIA in FIG. 17B.

The infrared absorbing layer 24 has a thickness of, for example, larger than or equal to 5 nm and smaller than or equal to 100 nm in the case where the infrared absorbing layer 24 is electrically conductive, and has a thickness of, for example, larger than or equal to 100 nm and smaller than or equal to 1000 nm in the case where the infrared absorbing layer 24 is not conductive. The insulation layer 25 has a thickness of, for example, larger than or equal to 10 nm and smaller than or equal to 300 nm.

The other configurations in the infrared sensor 1B of embodiment 2 are the same as or similar to those of the infrared sensor 1A of embodiment 1, including the preferred embodiments. The operating principle of the infrared sensor 1B of embodiment 2 is the same as that of the infrared sensor 1A of embodiment 1.

Embodiment 3

Figure 18A:
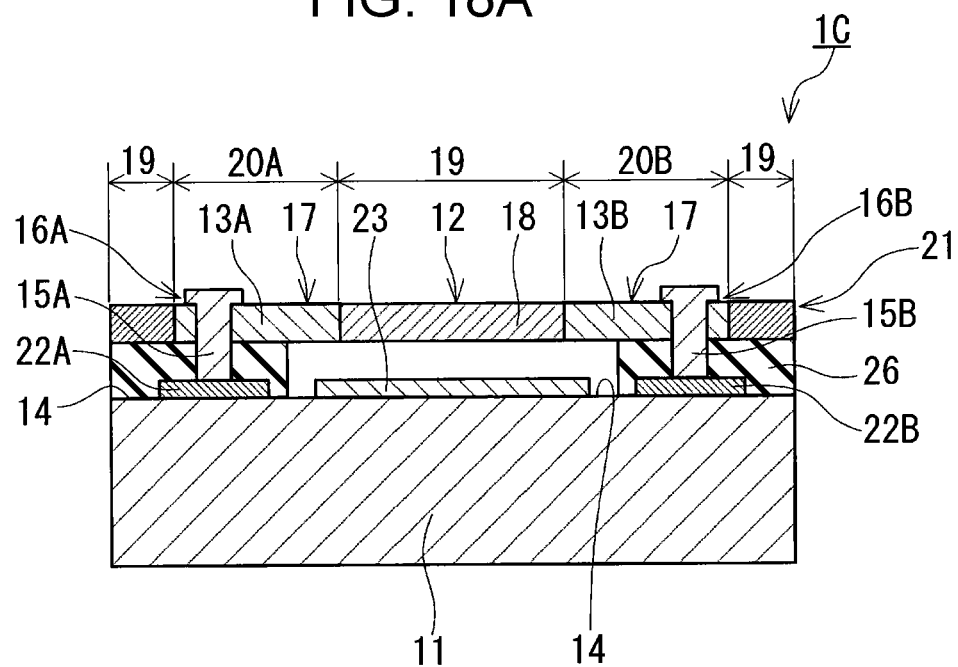
FIG. 18A is a schematic cross-sectional view of an infrared sensor of embodiment 3.
Figure 18B:
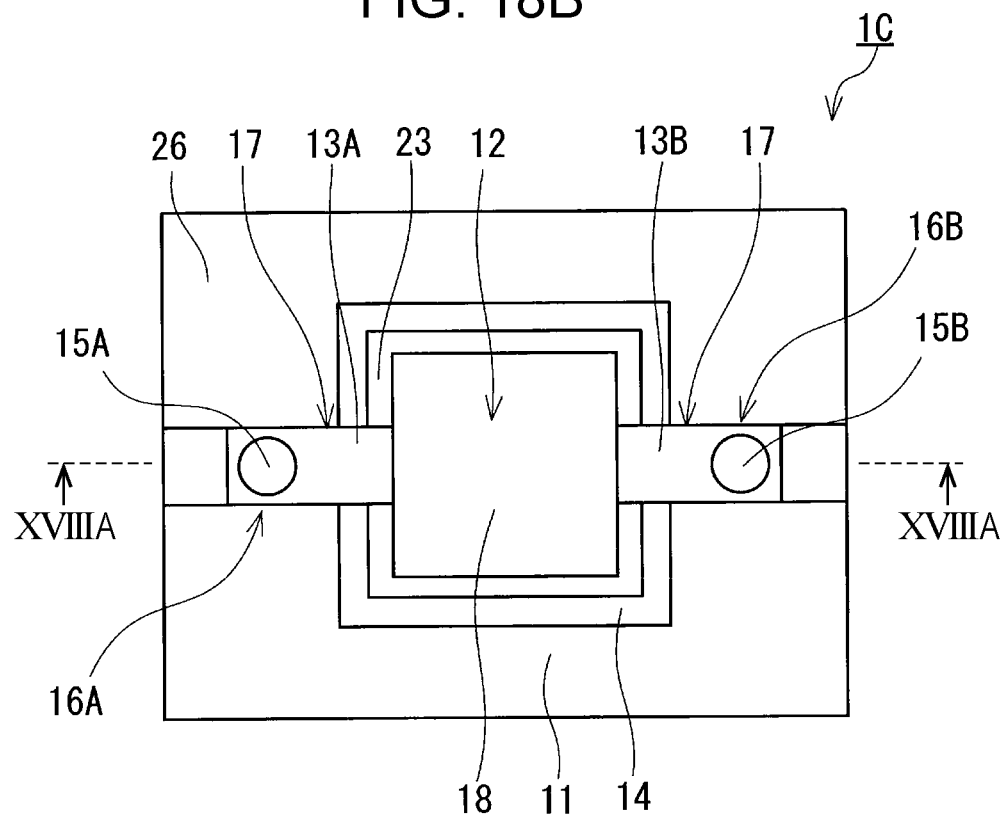
FIG. 18B is a schematic plan view of the infrared sensor of embodiment 3.

An infrared sensor of embodiment 3 is illustrated in FIGS. 18A and 18B. FIG. 18A is a cross sectional view of the infrared sensor 1C taken along line XVIIIA-XVIIIA in FIG. 18B. The infrared sensor 1C is a bolometer infrared sensor which is a type of a thermal infrared sensor.

The infrared sensor 1C further includes an insulation layer 26 on the base substrate 11. In cross-sectional view, the insulation layer 26 is disposed between the upper surface 14 of the base substrate 11 and the first and second beams 13A and 13B (the semiconductor layer 21). The insulation layer 26 is disposed to surround the infrared receiver 12 and the infrared reflection film 23 in plan view. In addition, the section of the first prop 15A between the first signal readout terminal 22A and the first beam 13A is surrounded by the insulation layer 26. The section of the second prop 15B between the second signal readout terminal 22B and the second beam 13B is surrounded by the insulation layer 26.

The material included in the insulation layer 26 is, for example, an oxide such as $SiO_2$. However, the material included in the insulation layer 26 is not limited to the above example.

The infrared sensor 1C has amorphous regions 19 at both ends of the semiconductor layer 21.

The other configurations in the infrared sensor 1C of embodiment 3 are the same as or similar to the corresponding configurations of the infrared sensor 1A of embodiment 1 or the infrared sensor 1B of embodiment 2, including the preferred embodiments. The operating principle of the infrared sensor 1C of embodiment 3 is the same as that of the infrared sensor 1A of embodiment 1.

Figure 19A:
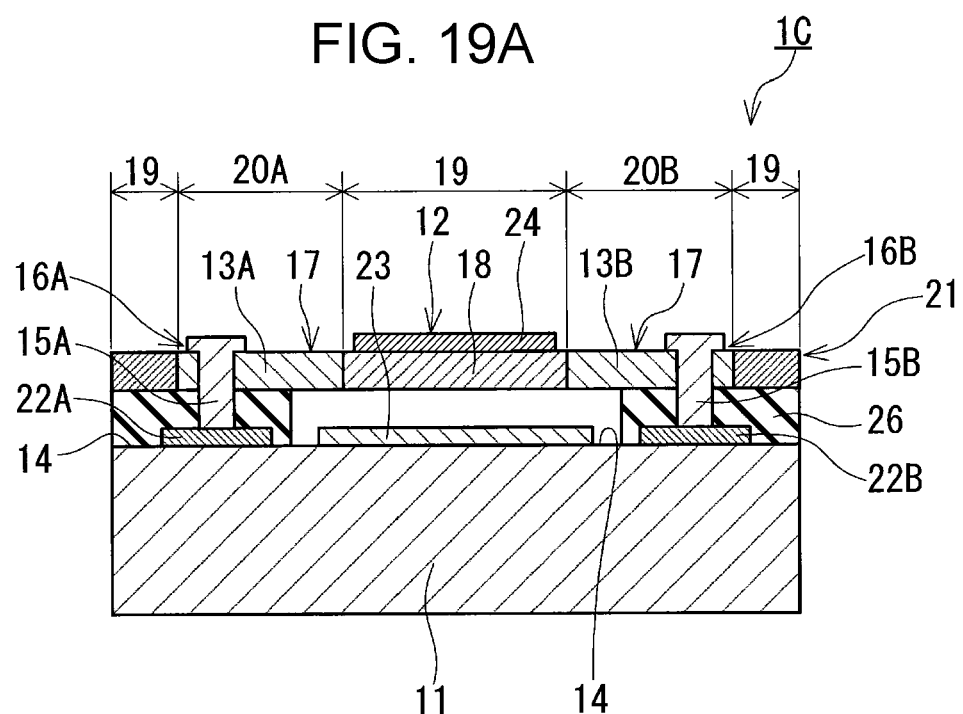
FIG. 19A is a schematic cross-sectional view of a modification example of the infrared sensor of embodiment 3.
Figure 19B:
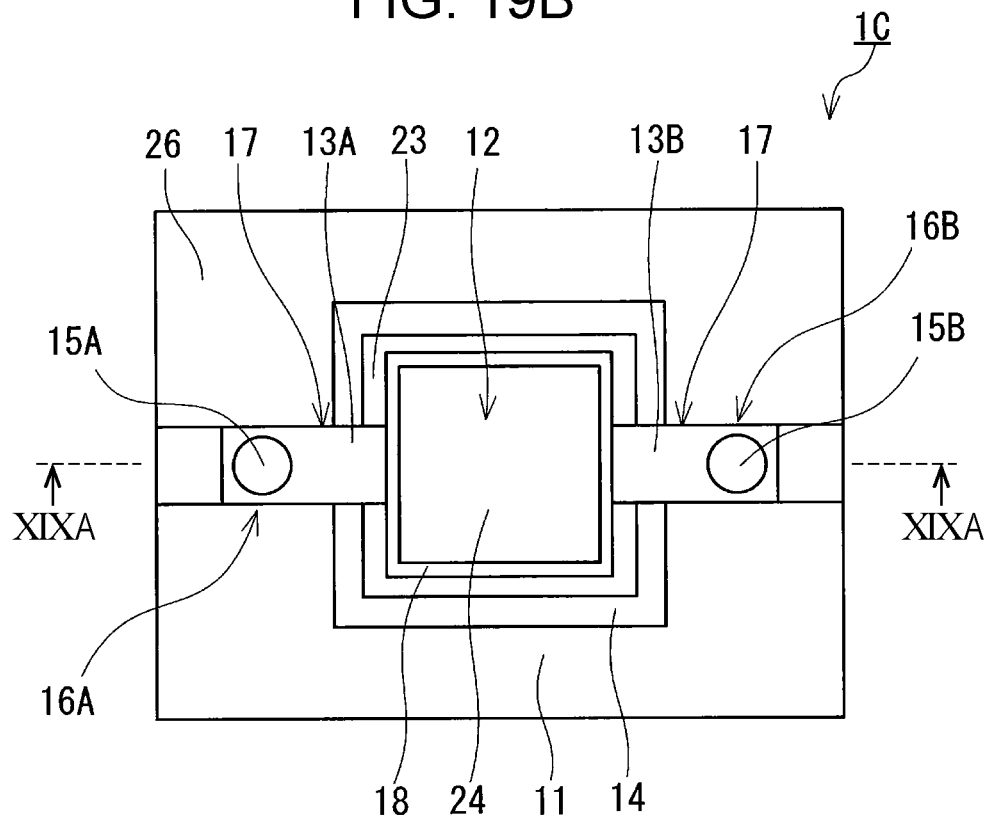
FIG. 19B is a schematic plan view of the modification example of the infrared sensor of embodiment 3.

Another concrete example of the infrared sensor 1C of embodiment 3 is illustrated in FIGS. 19A and 19B. FIG. 19A is a cross-sectional view of the infrared sensor 1C taken along line XIXA-XIXA in FIG. 19B. The infrared receiver 12 of the infrared sensor 1C illustrated in FIGS. 19A and 19B further includes an infrared absorbing layer 24. The infrared absorbing layer 24 is disposed on the resistance change portion 18. This configuration further improves the light receiving sensitivity of the infrared sensor 1C. The infrared absorbing layer 24 can have the foregoing configuration described in embodiment 2, including the preferred embodiments.

Figure 20A:
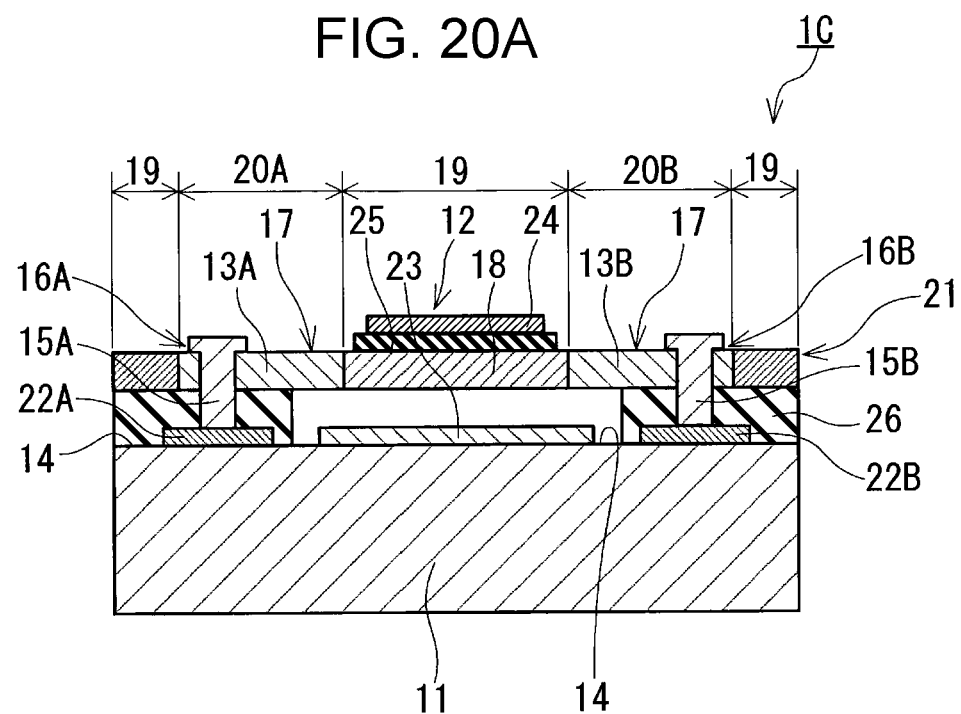
FIG. 20A is a schematic cross-sectional view of a modification example of the infrared sensor of embodiment 3.
Figure 20B:
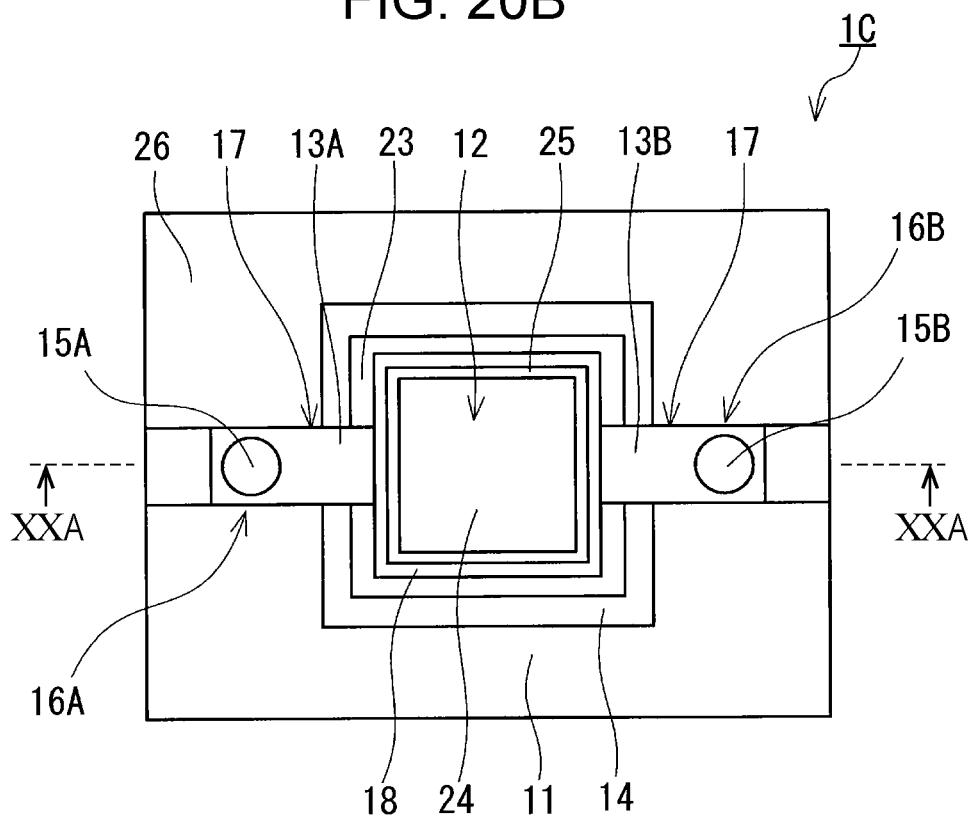
FIG. 20B is a schematic plan view of the modification example of the infrared sensor of embodiment 3.

Still another concrete example of the infrared sensor 1C of embodiment 3 is illustrated in FIGS. 20A and 20B. FIG. 20A is a cross-sectional view of the infrared sensor 1C taken along line XXA-XXA in FIG. 20B. The infrared receiver 12 of the infrared sensor 1C illustrated in FIGS. 20A and 20B further includes an insulation layer 25 and an infrared absorbing layer 24. The insulation layer 25 and the infrared absorbing layer 24 are stacked on the resistance change portion 18 in this order. The infrared absorbing layer 24 and the insulation layer 25 can have the foregoing configurations described in embodiment 2, including the preferred embodiments.

Embodiment 4

Figure 21:
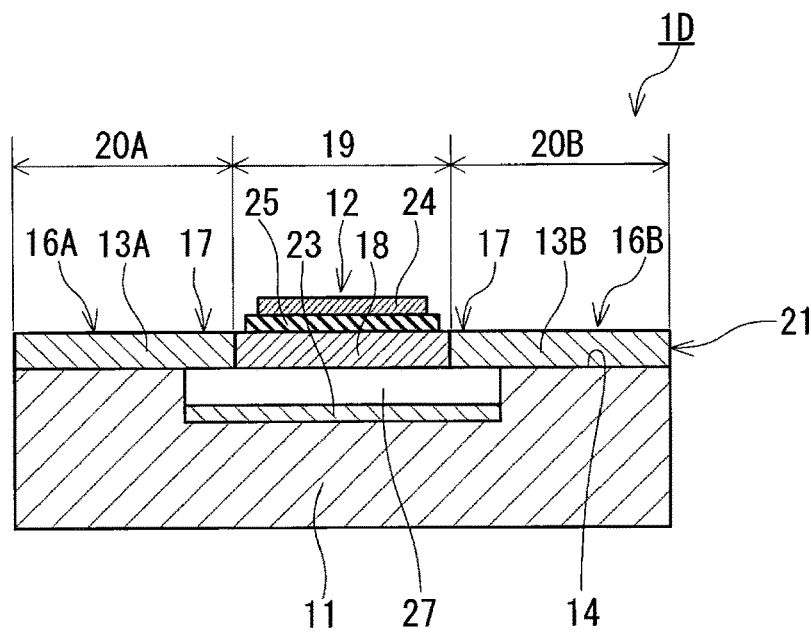
FIG. 21 is a schematic cross-sectional view of an infrared sensor of embodiment 4.

An infrared sensor of embodiment 4 is illustrated in FIG. 21. An infrared sensor 1D illustrated in FIG. 21 is a bolometer infrared sensor which is a type of a thermal infrared sensor. The infrared sensor 1D includes a base substrate 11, a bolometer infrared receiver 12, a first beam 13A, and a second beam 13B. Each of the first beam 13A and the second beam 13B has a connection portion 16A or 16B connected to the base substrate 11 and a separated portion 17 which is away from the base substrate 11. Each of the first beam 13A and the second beam 13B has the connection portion 16A or 16B at its one end. Each of the first beam 13A and the second beam 13B is physically joined to the infrared receiver 12 at its separated portion 17. The position at which each of the first beam 13A and the second beam 13B is physically joined to the infrared receiver 12 is its other end. The infrared receiver 12 is supported by the first beam 13A and the second beam 13B so as to be away from the base substrate 11. This separation increases the degree of thermal insulation between the base substrate 11 and the infrared receiver 12. The first beam 13A and the second beam 13B are electrically conductive. The first beam 13A and the second beam 13B have a function of physically supporting the infrared receiver 12 and a function as a path of the current, in other words, as wiring, for detecting the resistance of the resistance change portion 18 in the infrared receiver 12.

The base substrate 11 has a recess 27 in the upper surface 14 on which the infrared receiver 12 is provided. In plan view, the area of the recess 27 is larger than that of the infrared receiver 12. The infrared receiver 12 is surrounded by the outer edges of the recess 27 in plan view. The recess 27 is positioned between the base substrate 11 and the infrared receiver 12, the separated portion 17 of the first beam 13A, and the separated portion 17 of the second beam 13B. The first beam 13A is physically connected to the base substrate 11 at the connection portion 16A. The second beam 13B is physically connected to the base substrate 11 at the connection portion 16B. In cross-sectional view, the infrared receiver 12, the separated portion 17 of the first beam 13A, and the separated portion 17 of the second beam 13B are suspended over the recess 27 of the base substrate 11. This suspension increases the degree of thermal insulation between the base substrate 11 and the infrared receiver 12.

In the infrared sensor 1D, the resistance of the resistance change portion 18 included in the infrared receiver 12 is read out. For the readout, the infrared sensor 1D illustrated in FIG. 21 further includes a ROIC (not illustrated) inside the base substrate 11. The connection portion 16A of the first beam 13A is electrically connected to the ROIC. The connection portion 16B of the second beam 13B is electrically connected to the ROIC. The resistance of the resistance change portion 18 can be read out via the first beam 13A and the second beam 13B. The infrared sensor 1D may further include members for reading out the resistance of the resistance change portion 18.

When infrared light is incident on the infrared receiver 12, the temperature of the infrared receiver 12 increases. In this process, the more thermally insulated the infrared receiver 12 is from the base substrate 11, which serves as a heat bath, the more the temperature of the infrared receiver 12 increases. In the infrared sensor 1D including the bolometer infrared receiver 12, as the temperature increases, the resistance of the resistance change portion 18 changes. An electrical signal corresponding to the changed resistance is processed in the ROIC, and thus the infrared light is detected. Depending on the processing, the intensity of infrared light and/or the temperature of the target object can be measured with the infrared sensor 1D. Here, as for the infrared sensor of the present disclosure, the way of reading out the resistance of the resistance change portion 18 is not limited to methods using the ROIC provided inside the base substrate 11, as described earlier.

The infrared sensor 1A of embodiment 1 and the infrared sensor 1D of embodiment 4 are different in the way of suspending the infrared receiver 12, the first beam 13A, and the second beam 13B over the upper surface 14 of the base substrate 11. In the infrared sensor 1D of embodiment 4, the infrared reflection film 23 is disposed on the bottom surface of the recess 27. However, the infrared sensor 1D has the same configuration as the infrared sensor 1A in that the infrared reflection film 23 is disposed on the surface of the base substrate 11 at a position facing the infrared receiver 12. The other configurations of the infrared sensor 1D of embodiment 4 are the same as or similar to the corresponding configurations of the infrared sensor 1A of embodiment 1, including the preferred embodiments. The infrared sensor 1D of embodiment 4 may further include the infrared absorbing layer 24 included in the infrared sensors 1B and 1C of embodiments 2 and 3, or may further include the infrared absorbing layer 24 and the insulation layer 25.

The infrared sensor of the present disclosure may have any member other than the foregoing members as long as the configuration provides the effect of the present disclosure.

[Infrared Sensor Array]

The infrared sensors 1A to 1D of embodiments 1 to 4 function independently as an infrared sensor in principle. An infrared sensor may be used as a pixel, and a plurality of infrared sensors may be arranged in an array on the base substrate 11. The arrangement is typically in the form of a two-dimensional array. An array structure in which a plurality of infrared sensors are arranged enables, for example, imaging of an object having a finite temperature and/or evaluation of the strength distribution of infrared light radiation or a laser beam.

Here, at least some of the infrared sensors arranged in an array are infrared sensors of the present disclosure. All of the infrared sensors arranged in an array may be infrared sensors of the present disclosure. The present disclosure includes a sensor array that includes an infrared sensor array having a plurality of infrared sensors arranged in a two-dimensional array, the infrared sensors including an infrared sensor of the present disclosure.

[Method of Manufacturing Infrared Sensor]

The infrared sensor of the present disclosure can be manufactured by a combination of various thin-film forming methods such as chemical vapor deposition (CVD), sputtering, and vapor deposition; various microfabrication methods and pattern forming methods such as electron beam lithography, photolithography, block copolymer lithography, and selective etching; and various modification methods such as amorphization by doping, ion implantation, and the like, crystallization, and imparting conductivity. The block copolymer lithography is suitable for forming the phononic crystal structure A. Conductivity can be imparted to a semiconductor by doping it with impurities. Amorphization can be performed by implanting, into a crystalline semiconductor, ions of the element included in the base material of the semiconductor.

Hereinafter, an example of the method of manufacturing the infrared sensor of the present disclosure will be described below with reference to FIGS. 22A to 22Q. Here, in an infrared sensor 1E manufactured in the following method, the first beam 13A and the second beam 13B have the phononic crystal structure A. The method of manufacturing the infrared sensor of the present disclosure is not limited to the following example.

Figure 22A:
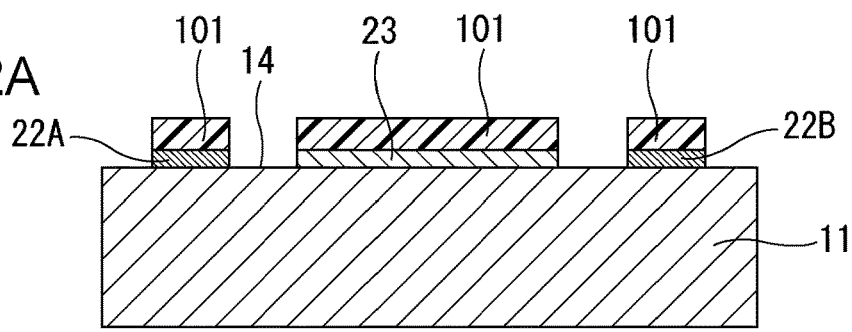
FIG. 22A is a schematic cross-sectional diagram for explaining an example of a method of manufacturing an infrared sensor of the present disclosure.

FIG. 22A: A base substrate 11 is prepared. Next, a metal layer is formed on the upper surface 14 of the base substrate 11. The metal layer is, for example, a Cr layer. The metal layer is formed, for example, by sputtering. The metal layer has a thickness of, for example, 200 nm. A photoresist 101 is formed on the formed metal layer. The metal layer is microfabricated by photolithography and selective etching using the photoresist 101 to form an infrared reflection film 23, a first signal readout terminal 22A, and a second signal readout terminal 22B.

Figure 22B:
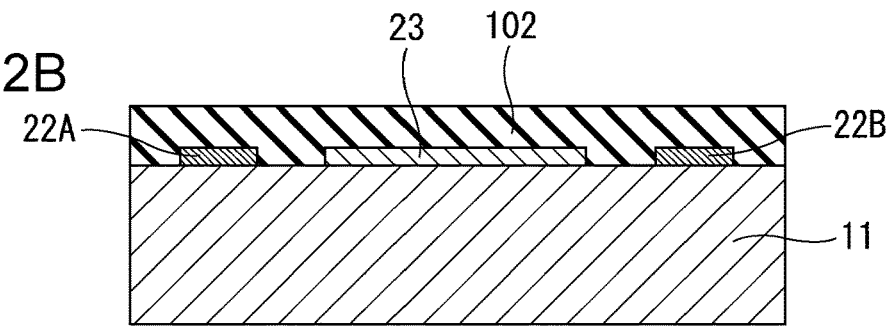
FIG. 22B is a schematic cross-sectional diagram for explaining the example of the method of manufacturing the infrared sensor of the present disclosure.

FIG. 22B: The photoresist 101 is removed. A sacrificial layer 102 is formed so as to cover the infrared reflection film 23, the first signal readout terminal 22A, and the second signal readout terminal 22B. The sacrificial layer 102 is, for example, a $SiO_2$ layer. The sacrificial layer 102 is formed, for example, by CVD. The sacrificial layer 102 has a thickness, for example, larger than or equal to 1 μm and smaller than or equal to 4 μm. The thickness of the sacrificial layer 102 corresponds to the separation distance between the infrared receiver 12 and the base substrate 11 in the infrared sensor 1E manufactured in this method.

Figure 22C:
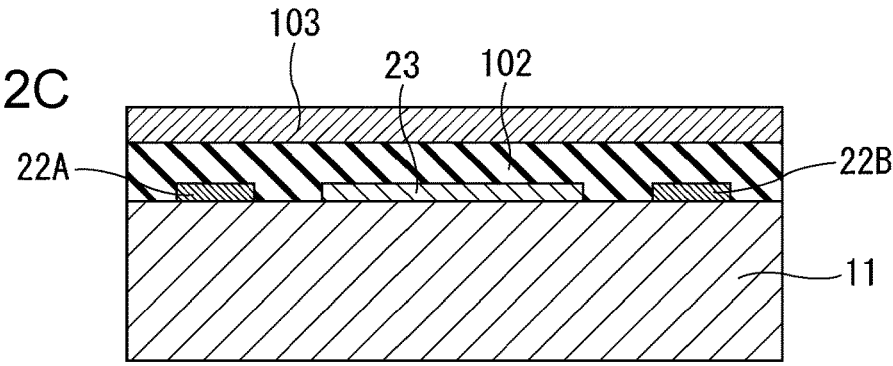
FIG. 22C is a schematic cross-sectional diagram for explaining the example of the method of manufacturing the infrared sensor of the present disclosure.

FIG. 22C: A crystalline semiconductor layer 103 is formed on the sacrificial layer 102. The semiconductor layer 103 is, for example, a Si layer or a SiGe layer. The semiconductor layer 103 is formed, for example, by CVD. The semiconductor layer 103 has a thickness of, for example, 100 nm.

Figure 22D:
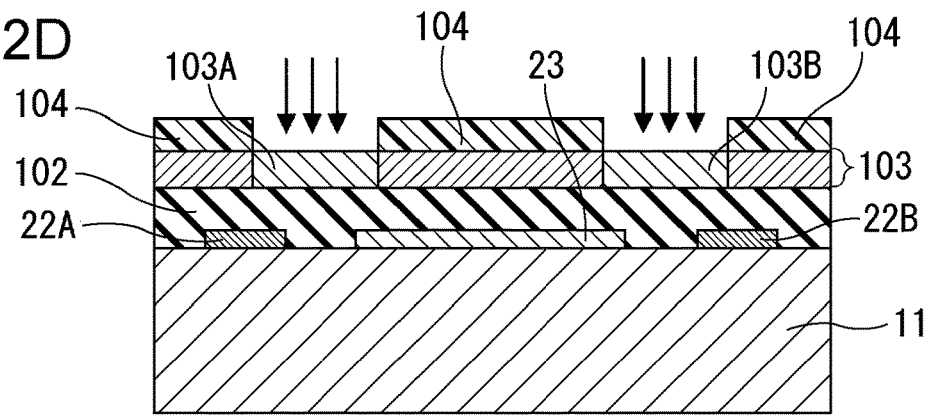
FIG. 22D is a schematic cross-sectional diagram for explaining the example of the method of manufacturing the infrared sensor of the present disclosure.

FIG. 22D: A photoresist 104 is formed on the semiconductor layer 103. A region 103A and a region 103B which are to be the first beam 13A and the second beam 13B in the semiconductor layer 103 are exposed by photolithography. Next, the exposed regions 103A and 103B are doped with impurities by ion implantation. The impurities are, for example, B or P. The amount of ion plantation is, for example, larger than or equal to $10^{17}$ cm$^{-3}$ and smaller than or equal to $10^{23}$ cm$^{-3}$, or it may be larger than or equal to $10^{19}$ cm$^{-3}$ and smaller than or equal to $10^{21}$ cm$^{-3}$.

Figure 22E:
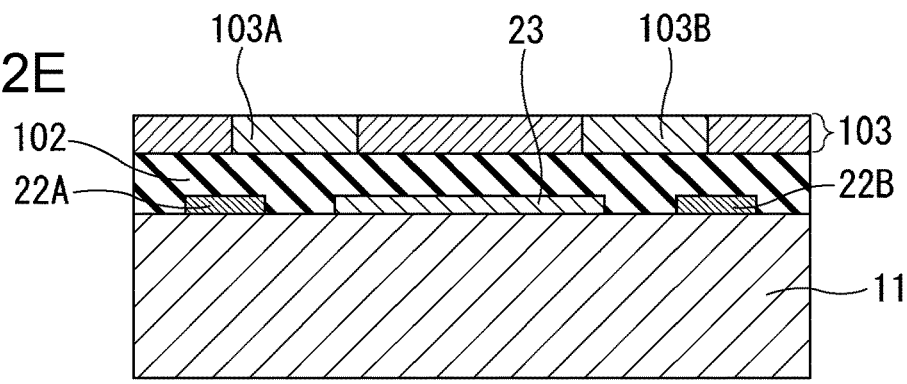
FIG. 22E is a schematic cross-sectional diagram for explaining the example of the method of manufacturing the infrared sensor of the present disclosure.

FIG. 22E: The photoresist 104 is removed. The entire part is activated by heating. The heating temperature is, for example, 1000° C. The activation process imparts conductivity to the regions 103A and 103B in which ions have been implanted. From the regions to which conductivity is imparted, the first beam 13A and the second beam 13B are formed by later microfabrication and pattern forming.

Figure 22F:
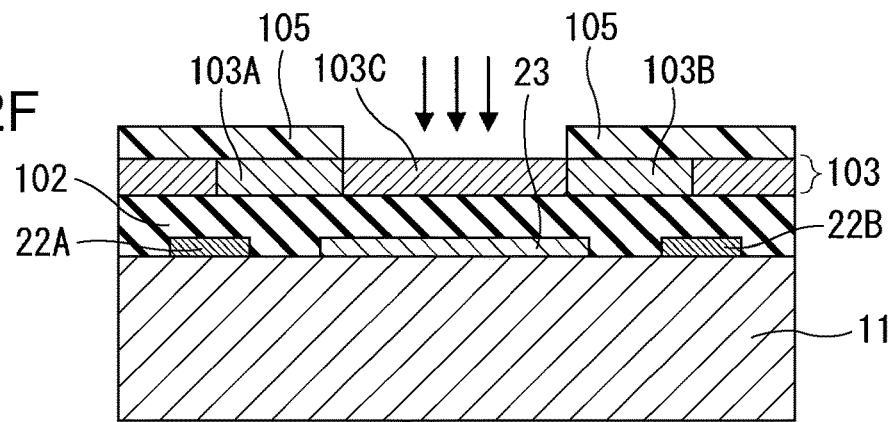
FIG. 22F is a schematic cross-sectional diagram for explaining the example of the method of manufacturing the infrared sensor of the present disclosure.

FIG. 22F: A photoresist 105 is formed on the semiconductor layer 103. A region 103C which is to be the resistance change portion 18 in the semiconductor layer 103 is exposed by photolithography. Next, ions of the same element as the element included in the base material of the semiconductor layer 103 are implanted into the exposed region 103C to make the region 103C amorphous. From the amorphized region 103C, the resistance change portion 18 is formed by later microfabrication and pattern forming. The both ends of the semiconductor layer 103 are crystalline but are left as regions 107 having no conductivity (see FIG. 22G).

Figure 22G:
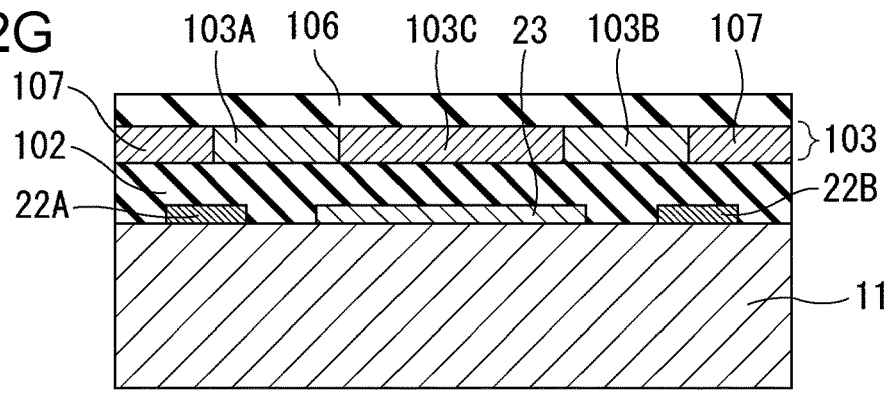
FIG. 22G is a schematic cross-sectional diagram for explaining the example of the method of manufacturing the infrared sensor of the present disclosure.

FIG. 22G: A hardware mask 106 is formed on the semiconductor layer 103. The hardware mask 106 is, for example, a SiO$_2$ layer. The hardware mask 106 is formed, for example, by CVD. The hardware mask 106 has a thickness of, for example, 25 nm. The hardware mask 106 is used to form the phononic crystal structure A that the first beam 13A and the second beam 13B have.

Figure 22H:
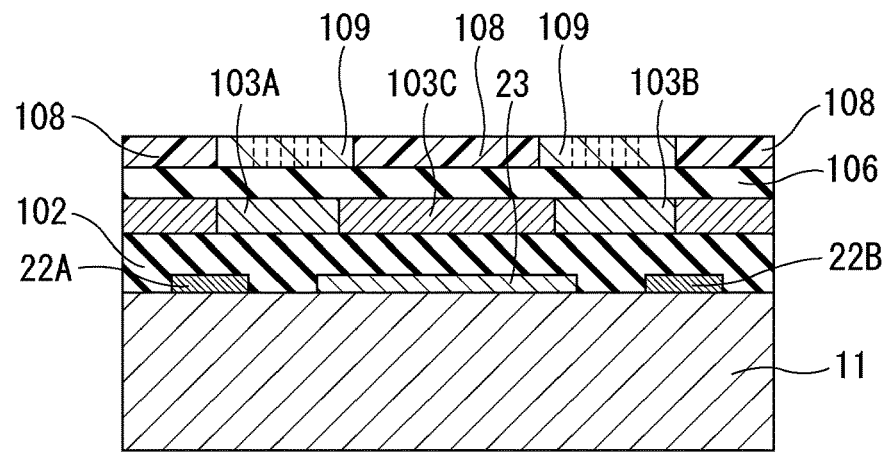
FIG. 22H is a schematic cross-sectional diagram for explaining the example of the method of manufacturing the infrared sensor of the present disclosure.

FIG. 22H: A photoresist 108 is formed on the hardware mask 106. The regions of the hardware mask 106 corresponding in plan view to the regions where the phononic crystal structure A is to be formed in the first beam 13A and the second beam 13B are exposed by photolithography. Next, a block copolymer self-assembly film 109 is formed on the exposed regions of the hardware mask 106. The self-assembly film 109 is used for block copolymer lithography to form the phononic crystal structure A.

Figure 22I:
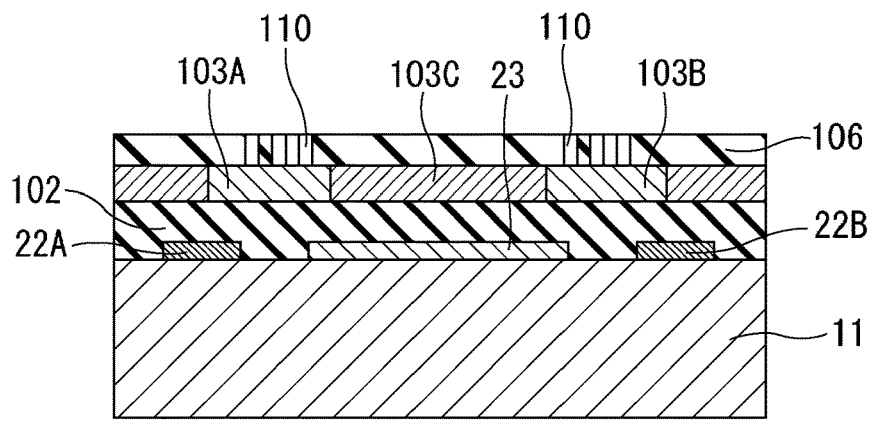
FIG. 22I is a schematic cross-sectional diagram for explaining the example of the method of manufacturing the infrared sensor of the present disclosure.

FIG. 22I: By the block copolymer lithography, a plurality of orderly arranged through holes 110 are formed in the hardware mask 106. The photoresist 108 and the self-assembly film 109 are removed.

Figure 22J:
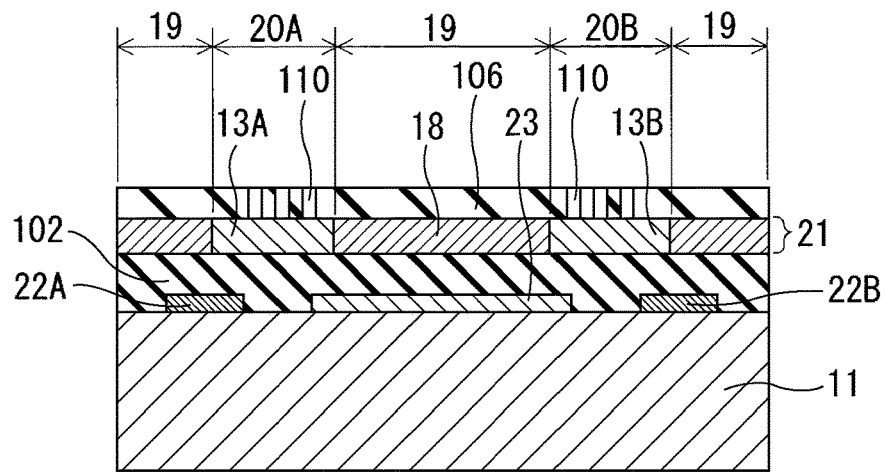
FIG. 22J is a schematic cross-sectional diagram for explaining the example of the method of manufacturing the infrared sensor of the present disclosure.

FIG. 22J: A photoresist is formed on the hardware mask 106. Microfabrication and pattern forming are performed on the semiconductor layer 103 by photolithography to form the first beam 13A, the second beam 13B, and the resistance change portion 18. The first beam 13A, the second beam 13B, and the resistance change portion 18 are included in a single-layered semiconductor layer 21.

Figure 22K:
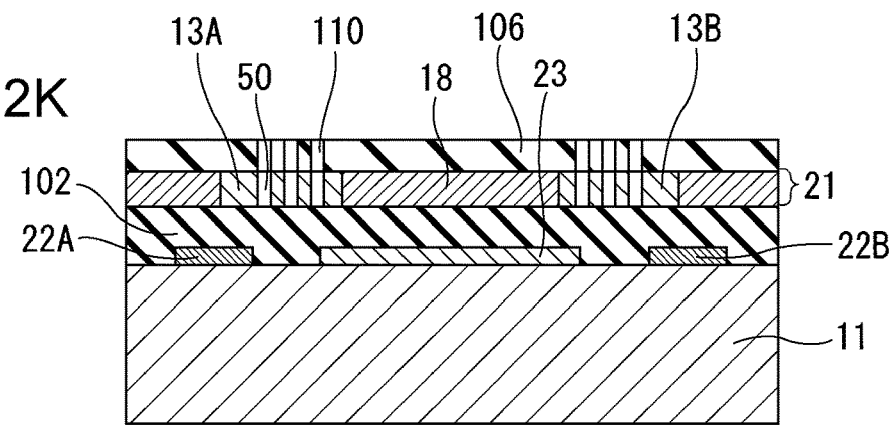
FIG. 22K is a schematic cross-sectional diagram for explaining the example of the method of manufacturing the infrared sensor of the present disclosure.

FIG. 22K: The photoresist on the hardware mask 106 is removed. By selective etching using the hardware mask 106 as a resist, a plurality of orderly arranged through holes 50 are formed in the first beam 13A and the second beam 13B at the positions corresponding to the through holes 110 in plan view. With the formed through holes 50, the phononic crystal structure A is formed.

Figure 22L:
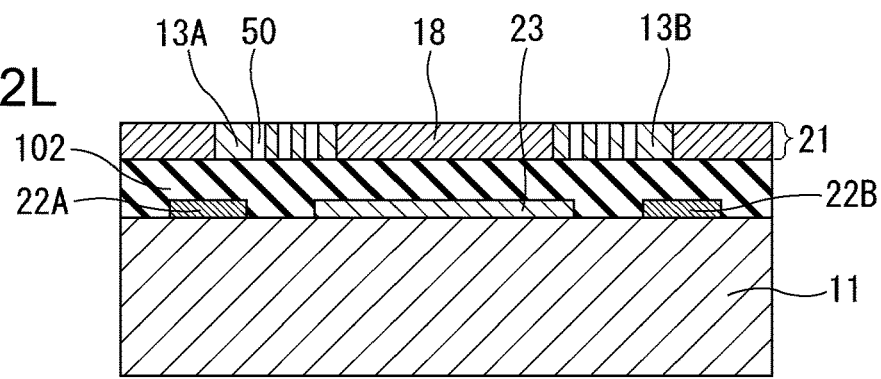
FIG. 22L is a schematic cross-sectional diagram for explaining the example of the method of manufacturing the infrared sensor of the present disclosure.

FIG. 22L: The hardware mask 106 is removed.

Figure 22M:
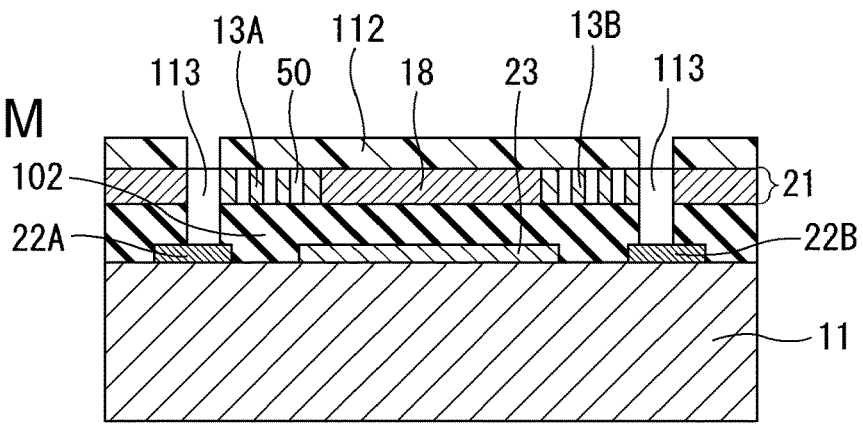
FIG. 22M is a schematic cross-sectional diagram for explaining the example of the method of manufacturing the infrared sensor of the present disclosure.

FIG. 22M: A photoresist 112 is formed on the semiconductor layer 21.

Contact holes 113 are formed in the semiconductor layer 21 and the sacrificial layer 102 by photolithography to expose the first signal readout terminal 22A and the second signal readout terminal 22B.

Figure 22N:
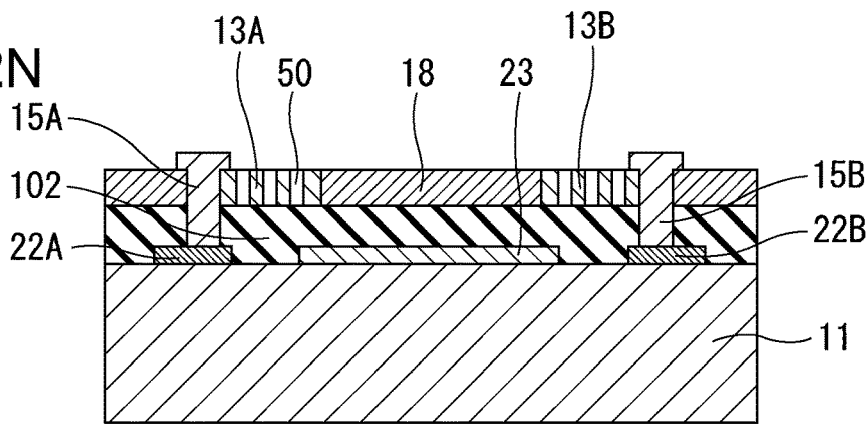
FIG. 22N is a schematic cross-sectional diagram for explaining the example of the method of manufacturing the infrared sensor of the present disclosure.

FIG. 22N: Metal is deposited in the formed contact holes 113 to form a first prop 15A and a second prop 15B. The metal used for the deposition is, for example, Al. The first prop 15A and the second prop 15B are formed, for example, by sputtering.

Figure 22O:
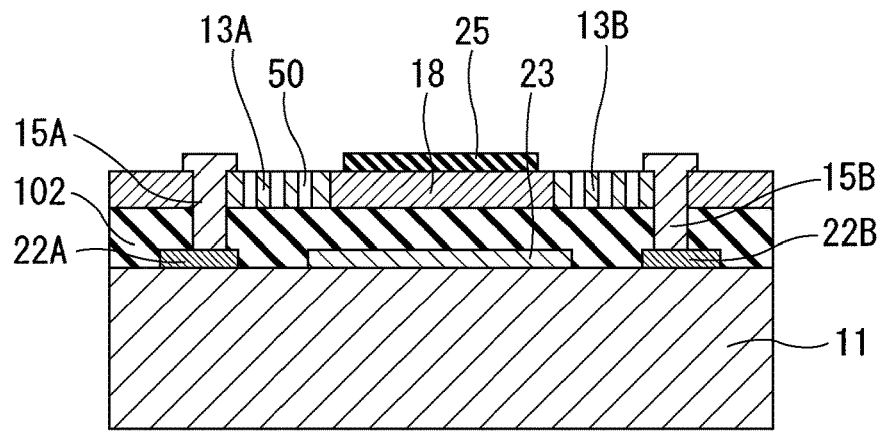
FIG. 22O is a schematic cross-sectional diagram for explaining the example of the method of manufacturing the infrared sensor of the present disclosure.

FIG. 22O: An insulation layer 25 is formed on the semiconductor layer 21. The formed insulation layer 25 is surrounded by the resistance change portion 18 in plan view. The insulation layer 25 is, for example, a SiN layer. The insulation layer 25 is formed, for example, by CVD. The insulation layer 25 has a thickness of, for example, 20 nm. Photolithography can be used for forming the insulation layer 25.

Figure 22P:
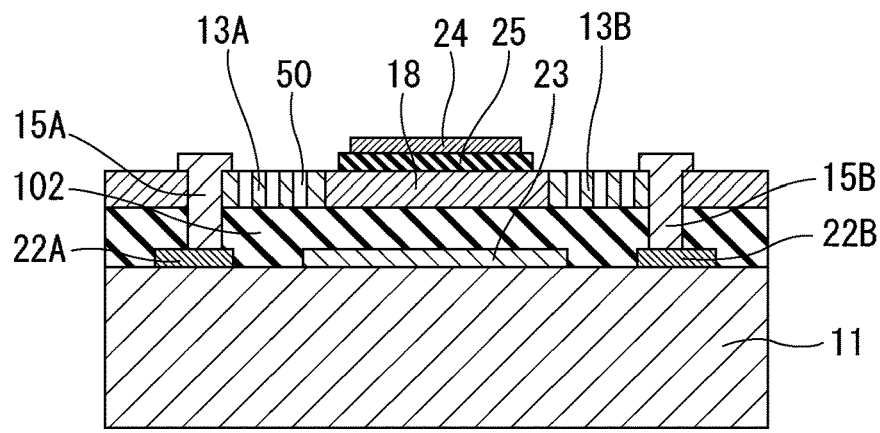
FIG. 22P is a schematic cross-sectional diagram for explaining the example of the method of manufacturing the infrared sensor of the present disclosure.

FIG. 22P: An infrared absorbing layer 24 is formed on the insulation layer 25. The formed infrared absorbing layer 24 is surrounded by the insulation layer 25 in plan view. The infrared absorbing layer 24 is, for example, a TiN layer. The infrared absorbing layer 24 is formed, for example, by sputtering. The infrared absorbing layer 24 has a thickness of, for example, 8 nm.

Figure 22Q:
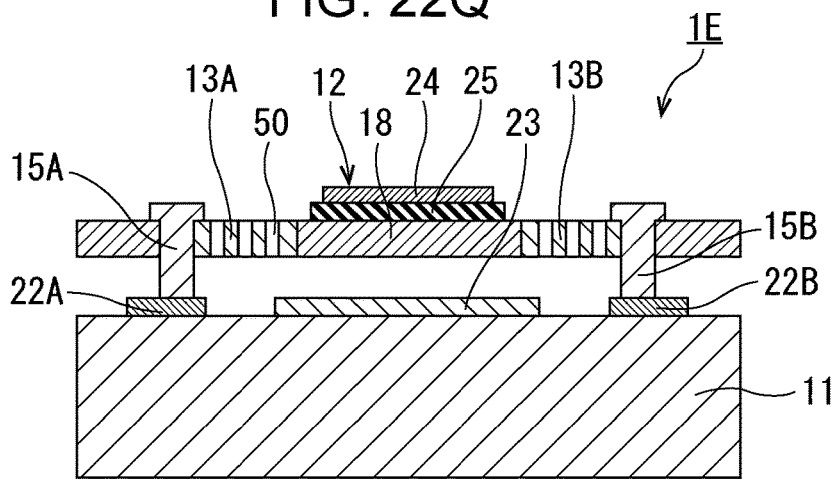
FIG. 22Q is a schematic cross-sectional diagram for explaining the example of the method of manufacturing the infrared sensor of the present disclosure.

FIG. 22Q: The sacrificial layer 102 is removed, for example, by vapor phase hydrogen fluoride (HF) etching. Through these processes, the infrared sensor 1E, which is an embodiment of the infrared sensor of the present disclosure, is manufactured. Note that an insulation layer 26 can be formed by performing pattern etching on the sacrificial layer 102.

In the above manufacturing method, the resistance change material and the resistance change portion 18 including the resistance change material are formed by implanting, into the base material of the crystalline semiconductor, ions of the element included in the base material. In other words, the present disclosure includes a method of manufacturing the infrared sensor of the present disclosure in which the resistance change portion 18 is formed by implanting, into the crystalline base material, ions of the element included in the base material.

In the infrared sensor 1E manufactured according to the above manufacturing method, the infrared receiver 12 includes the resistance change portion 18 including the resistance change material, and the resistance change portion 18 and the first and second beams 13A and 13B are an amorphous region and crystalline regions, respectively, of the semiconductor layer 21 including the same base material. In the above manufacturing method, the semiconductor layer 103 which is a crystalline layer including a crystalline base material is formed at a position away from the base substrate 11 (FIG. 22C), and ions of the element included in the base material are implanted into a region 103C of the formed semiconductor layer 103 to form an amorphous region in part of the semiconductor layer 103. Thus, the semiconductor layer 21 is formed having the resistance change portion 18 corresponding to the formed amorphous region and the first beam 13A and the second beam 13B corresponding to the crystalline regions where the crystalline structure of the base material remains. In other words, the present disclosure is a method of manufacturing the infrared sensor of the present disclosure, including the following method. The resistance change portion and the first and second beams are an amorphous region and crystalline regions, respectively, of the semiconductor layer including the above base material. A crystalline layer including the crystalline base material is formed at a position away from the base substrate. Ions of the element included in the base material is implanted into a region of the formed crystalline layer to form an amorphous region in part of the crystalline layer. Thus, the semiconductor layer is formed having the resistance change portion corresponding to the formed amorphous region and the first and second beams corresponding to the crystalline regions where the crystalline structure of the base material remains.

The infrared sensor of the present disclosure can be used for various applications including ones for conventional infrared sensors.

What is claimed is:

1. An infrared sensor comprising:
a base substrate;
an infrared receiver;
a first beam; and
a second beam, wherein:
each of the first beam and the second beam has a connection portion connected to the base substrate and/or a member on the base substrate and a separated portion away from the base substrate, and is physically joined to the infrared receiver at the separated portion,
the infrared receiver is supported by the first beam and the second beam to be away from the base substrate,
the infrared receiver includes a resistance change portion including a resistance change material an electrical resistance of which changes with temperature,
the resistance change portion includes an amorphous semiconductor,
each of the first beam and the second beam includes a crystalline semiconductor made of a base material same as a base material of the resistance change material, and is electrically connected to the resistance change portion at the separated portion,
the first beam and the second beam are doped with impurities,
a concentration of the impurities, with which the first beam and the second beam are doped, changes continuously at an interface between each of the first and second beams and the resistance change portion along a direction normal to the interface,
in a vicinity of the interface, a gradient of the concentration of the impurities, with which the first beam and the second beam are doped, along the direction normal to the interface is smaller than or equal to $10^{18}$ cm$^{-3}$/nm, and
the vicinity of the interface is an area from the interface to a region a specified distance away from the interface in the direction normal to the interface.

2. The infrared sensor according to claim 1, wherein the base material is silicon or silicon germanium.

3. The infrared sensor according to claim 1, wherein the infrared receiver further includes an insulation layer and an infrared absorbing layer, and
the insulation layer is disposed on the resistance change portion and the infrared absorbing layer is disposed on the insulation layer.

4. The infrared sensor according to claim 1, wherein the resistance change portion is an amorphous region of a semiconductor layer including the base material and the first and second beams are crystalline regions of the semiconductor layer including the base material.

5. The infrared sensor according to claim 1, further comprising:
a first prop and a second prop disposed on the base substrate and extending in a direction away from an upper surface of the base substrate, wherein
the first prop and the second prop are electrically conductive,
the first beam is connected to the first prop at the connection portion,
the second beam is connected to the second prop at the connection portion, and
the infrared receiver, the first beam, and the second beam are suspended over the base substrate by the first prop and the second prop in cross-sectional view.

6. The infrared sensor according to claim 1, wherein the base substrate has a recess,
the recess is positioned between the base substrate and the infrared receiver, the separated portion of the first beam, and the separated portion of the second beam,
each of the first beam and the second beam is connected to the base substrate at the connection portion, and
the infrared receiver, the separated portion of the first beam, and the separated portion of the second beam are suspended over the recess of the base substrate in cross-sectional view.

7. The infrared sensor according to claim 1, further comprising:
an infrared reflection film on a surface of the base substrate at a position facing the infrared receiver.

8. The infrared sensor according to claim 1, further comprising:
a readout integrated circuit (ROIC) inside the base substrate.

9. The infrared sensor according to claim 1, wherein
a section of the first beam, the section being between a portion joined to the infrared receiver and the connection portion, has a first phononic crystal structure having a plurality of through holes that are orderly arranged, and
a section of the second beam, the section being between a portion joined to the infrared receiver and the connection portion, has a second phononic crystal structure having a plurality of through holes that are orderly arranged.

10. The infrared sensor according to claim 9, wherein
the first phononic crystal structure includes a first domain and a second domain which are phononic crystal regions,
through holes of the through holes included in the first domain are orderly arranged in a first direction in plan view,
through holes of the through holes included in the second domain are orderly arranged in a second direction in plan view, the second direction being different from the first direction,
the second phononic crystal structure includes a third domain and a fourth domain which are phononic crystal regions,
through holes of the through holes included in the third domain are orderly arranged in a third direction in plan view, and
through holes of the through holes included in the fourth domain are orderly arranged in a fourth direction in plan view, the fourth direction being different from the third direction.

11. An infrared sensor array comprising:
a plurality of infrared sensors arranged in a two-dimensional array, wherein the infrared sensors include the infrared sensor according to claim 1.

12. A method of manufacturing the infrared sensor according to claim 1, comprising:
forming the resistance change portion by implanting, into the base material which is crystalline, ions of an element included in the base material.

13. The method of manufacturing the infrared sensor according to claim 12, wherein
the resistance change portion is an amorphous region of a semiconductor layer including the base material and the first and second beams are crystalline regions of the semiconductor layer including the base material,
a crystalline layer including the base material that is crystalline is formed at a position away from the base substrate, and
the amorphous region is formed in part of the crystalline layer by implanting ions of an element included in the base material into a region of the crystalline layer formed, so as to form the semiconductor layer having the resistance change portion corresponding to the amorphous region formed and the first and second beams corresponding to the crystalline regions in which a crystalline structure of the base material remains.

* * * * *